United States Patent
Fujihira

(10) Patent No.: US 6,734,496 B2
(45) Date of Patent: May 11, 2004

(54) SEMICONDUCTOR DEVICE

(75) Inventor: Tatsuhiko Fujihira, Kawasaki (JP)

(73) Assignee: Fuji Electric Co., Ltd., Kanagawa (JP)

( * ) Notice: Subject to any disclaimer, the term of this patent is extended or adjusted under 35 U.S.C. 154(b) by 67 days.

(21) Appl. No.: 10/115,995

(22) Filed: Apr. 5, 2002

(65) Prior Publication Data

US 2002/0105024 A1 Aug. 8, 2002

Related U.S. Application Data

(62) Division of application No. 09/583,016, filed on May 30, 2000, now Pat. No. 6,627,948, which is a division of application No. 08/786,473, filed on Jan. 21, 1997, now Pat. No. 6,097,063.

(30) Foreign Application Priority Data

Jan. 22, 1996  (JP) .............................. 8/007935

(51) Int. Cl.[7] ...................... H01L 29/76; H01L 29/94; H01L 21/337
(52) U.S. Cl. .................. 257/339; 257/341; 257/342; 257/372; 257/375; 257/376; 257/409; 438/188; 438/197; 438/199; 438/454
(58) Field of Search ................... 257/335–339, 257/341–343, 345, 3, 46, 347, 372, 375, 376, 401, 409; 438/188, 197, 199

(56) References Cited

U.S. PATENT DOCUMENTS

| | | | |
|---|---|---|---|
| 4,754,310 A | * | 6/1988 | Coe |
| 4,963,947 A | | 10/1990 | Beneking ....................... 357/4 |
| 5,216,275 A | * | 6/1993 | Chen ......................... 257/493 |
| 5,264,719 A | | 11/1993 | Beasom ....................... 257/335 |
| 5,294,824 A | | 3/1994 | Okada ......................... 257/409 |
| 5,438,215 A | | 8/1995 | Tihanyi | 
| 6,168,983 B1 | * | 1/2001 | Rumennik et al. .......... 438/188 |

FOREIGN PATENT DOCUMENTS

| | | |
|---|---|---|
| EP | 0 053 854 | 6/1982 |
| EP | 0164096 | 12/1985 |
| JP | 07086580 | 3/1995 |
| JP | 07245410 | 9/1995 |

OTHER PUBLICATIONS

"A Lateral COMFET Made in Thin Silicon–on–insulator Film", Colinge et al, IEEE Electron Device Letters, vol. Edl–7, No. 12, Dec. 1986, pp. 697–699.

"The Pinch Rectifier: A Low–Forward–Drop High–Speed Power Diode", Baliga, IEEE Electron Device Letters, vol. Edl–5, No. 6, Jun. 1986, pp. 194–196.

"Comparison of Lateral and Vertical DMOS Specific On–Resistance", Amato et al., CH2252–5. 85/0000–0736 S1.00 C 1985 IEEE, pp. 736–739.

* cited by examiner

*Primary Examiner*—Kang Donghee
(74) *Attorney, Agent, or Firm*—Venable LLP; Michael A. Sartori

(57) ABSTRACT

A semiconductor device has a drift region in which a drift current flows if it is in the ON mode and which is depleted if it is in the OFF mode. The drift region is formed as a structure having a plurality of first conductive type divided drift regions and a plurality of second conductive type compartment regions in which each of the compartment regions is positioned among the adjacent drift regions in parallel to make p-n junctions, respectively.

3 Claims, 13 Drawing Sheets

SEMICONDUCTOR DEVICE

This application is a division U.S. patent application Ser. No. 08/786,473, now U.S. Pat. No. 6,097,063 filed Jan. 21, 1997, which is a division of U.S. patent application Ser. No. 09/583,016, now U.S. Pat. No. 6,627,948 filed May 30, 2000, which are incorporated herein by reference.

BACKGROUND OF THE INVENTION

1. Field of the Invention

The present invention relates to a semiconductor device with a large current capacity and a high breakdown voltage, such as a metal-oxide semiconductor field-effect transistor (MOSFET), an IGBT, a bipolar transistor, and semiconductor diode, and also the present invention relates to a method for fabricating the semiconductor device mentioned above.

2. Description of Prior Art

In general, structures of the semiconductor elements can be roughly grouped into two types: a lateral structure having an electric contact portion on one side thereof; and a vertical structure having electric contact portions on both sides thereof.

One example of a semiconductor element with the lateral structure is a SOI (silicon on insulator)—MOSFET (metal oxide silicon field effect transistor) shown in FIG. 1A and FIG. 1B, in which FIG. 1A is a plan view of the semiconductor element, while FIG. 1B is a cross-sectional view of the semiconductor along a line 1B–1B' in FIG. 1A.

A structure of the SOI-MOSFET is based on an offset gate structure of an n-channel MOSFET, in which a p-type channel diffusion layer 7, an n$^+$-type low doped drain region (drain/drift region) 90, and an n$^+$-type drain region 9 are formed on a semiconductor base plate 5 via an insulation membrane 6 in that order. In addition, an n$^+$-type source region 8 is formed on a part of a surface of the p-type channel diffusion layer 7, and also an insulation layer 12 is formed on a region extending from an end portion of the region 8 to an end of the n$^+$-type drain region 9. Particularly, in close proximity to the above n$^+$-type source region 8, the insulating film 12 has a remainder portion 10 which is thinner than the rest of the insulating film and is positioned on the boundary of the p-type channel diffusion layer 7 and the n$^+$-type low doped drain region 90. A gate electrode 11 is formed so as to cover the insulation film 12 from its thin portion 10 to its thick portion.

The low doped drain region 90 can be operated as a drift region for transferring carriers due to the effect of an electrical field if the MOSFET is in the ON mode. If the low doped drain region 90 is in the OFF mode, on the other hand, it becomes a depletion region to reduce an electric field strength applied thereon, resulting in an increase in breakdown voltage. It is possible to reduce the drift resistance of the low doped drain region 90 by increasing the concentration of impurities in the low doped drain region 90 and by decreasing electricity flowing through the region 90. As a result, a substantial ON resistance (drain-source resistance) of the MOSFET can be lowered. In this case, however, it will be difficult to extend the boundaries of the depletion layer between the drain and the channel to be developed from a p-n junction between the p-type channel diffusion layer 7 and the n-type low doped drain region 90, so that the maximum permissible (critical) electric field strength of silicon is reached at an earlier time, resulting in a reduction in the breakdown voltage (drain-source voltage). Hence, a trade-off relationship exists between the ON resistance (current capacity) and the breakdown voltage. Similarly, it has been known that the semiconductors such as IGBT, bipolar transistors, and semiconductor diodes make the above trade-off relationship.

Referring now to FIGS. 2A and 2B, another example of the conventional MOSFETs having a lateral structure will be described in detail, in which FIG. 2A is a cross-sectional view of a p-channel MOSFET and FIG. 2B is a cross-sectional view of a double diffusion type n-channel MOSFET.

The p-channel MOSFET shown in FIG. 2A comprises a n-type channel diffusion layer 3 formed on a p-type semiconductor layer 4, a gate electrode 11 with a field plate formed on the diffusion layer 3 via a gate insulation film 10, a p$^+$-type source region 18 formed on a part of the diffusion layer 3 in close proximity to one end of the gate electrode 11, a p-type low doped drain region (drain/drift region) 14 formed as a well having an end immediately underneath the other end of the gate electrode 11, a n$^+$-type contact region 71 adjacent to the p$^+$-type source region 18, a thick insulation film 12 formed on the p-type low doped drain region 14. In this structure, therefore, its ON resistance and breakdown voltage can be defined as the trade-off relationship based on the amount of electricity flowing through the well-shaped p-type low doped drain region 14 and the concentration of its impurities.

The double diffusion type n-channel MOSFET shown in FIG. 2B comprises a n-type low doped drain layer (drain/drift layer) 22 formed on a p-type semiconductor layer 4, a gate electrode 11 with a field plate formed on the low doped drain layer 22 via a gate insulation film 10, a p-type channel diffusion region 17 formed on a part of the low doped drain layer 22 in close proximity to one end of the gate electrode 11, n$^+$-type source region 8 formed as a well in the p-type channel diffusion region 17, an n$^+$-type drain region 9 formed as a well positioned at a distance from the n$^+$-type source region 8 and the gate electrode 11, a well-shaped p-type top layer 24 formed on a surface layer between the gate electrode 11 and the n$^+$-type drain region 9, a p$^+$-type contact region 72 adjacent to the n$^+$-type source region 8, and a thick insulation film 12 formed on the p-type top layer 24. In this structure, therefore, its ON resistance and breakdown voltage can be defined as the trade-off relationship based on the amount of electricity flowing through the well-shaped n-type low doped drain region 22 and the concentration of its impurities.

In the structure of FIG. 2B, however, the n-type low doped drain layer 22 is sandwiched between the p-type semiconductor layer 4 and the p-type top layer 24, so that it can be provided as the structure with a high breakdown voltage if the MOSFET is in the OFF mode because the low doped drain layer 22 is depleted at an earlier time by widening a depletion layer not only from the p-n junctions ja with the p-type channel diffusion region 17 but also from p-n junctions jb of upper and lower sides of the n-type low doped drain layer 22 while the concentration of impurities in the low doped drain layer 22 can be increased.

FIG. 3 shows a trench gate type n-channel MOSFET as an example of the vertical semiconductor element. The n-channel MOSFET comprises a n-type low doped drain layer 39 formed on a n$^+$-type drain layer 29 electrically contacted with a back electrode (not shown), a trench gate electrode 21 imbedded in a trench formed on a surface of the low doped drain layer 39 via a gate insulation film 10, a p-type channel diffusion layer 27 formed on a surface of the low doped drain layer 39 at a relatively shallow depth compared with that of the trench gate electrode 21, a n$^+$-type source region 18 formed along an upper edge of the trench gate electrode 21, and a thick insulation film 12 as a sheathing of the gate electrode 21. By the way, it is possible to make a n-type IGBT structure using a double structure made of a n$^+$-type upper layer and a p$^+$-type under layer instead of the single layered n$^+$-drain layer 29. In this kind of the vertical structure, therefore, the low doped drain layer 39 acts as a drift region for drift current flowing in the vertical direction if the MOSFET is in the ON mode, while it is depleted to increase its breakdown voltage if the MOSFET is in the OFF mode. In this case, its ON resistance and breakdown voltage can be defined as the trade-off relationship on the basis of a thickness of the low doped drain layer 39 and the concentration of its impurities.

FIG. 4 is a graph that shows the relationship between an ideal breakdown voltage and an ideal ON resistance of the silicon n-channel MOSFET. In this figure, it is based on the hypothesis that the breakdown voltage cannot be lowered by changing its form and that the ideal ON resistance is small enough to ignore electrical resistance of the regions except the low doped drain region.

In FIG. 4, the line A represents the relationship between an ideal breakdown voltage and an ideal ON resistance of the vertical structure type n-channel MOSFET of FIG. 3; the line B represents the relationship between an ideal breakdown voltage and an ideal ON resistance of a n-channel type MOSFET like the MOSFET of FIG. 2A where the p-channel type is replaced by an n-channel type; the line D represents the relationship between an ideal breakdown voltage and an ideal ON resistance of the vertically structured double diffused n-channel MOSFET of FIG. 2B; and the line C represents the relationship between an ideal breakdown voltage and an ideal ON resistance of the n-channel MOSFET of FIG. 11.

The vertical n-channel MOSFET is constructed so as to match the direction of the drift current flowing in the ON mode and the direction of expanding the depletion layer caused by a reverse bias in the OFF mode. For the low doped drain layer 39 of FIG. 3, an approximation of the breakdown voltage BV at the time of the OFF mode can be obtained by the following equation:

$$BV = E_c^2 \grave{a}_o \grave{a}_{si} \acute{a}(2-\acute{a})/2qN_D \qquad (1)$$

wherein $E_c$ is Ec ($N_D$) which is the maximum electric field strength of silicon at the impurity concentration of $N_D$;

$\grave{a}_o$ is a dielectric constant in a vacuum;

$\grave{a}_{si}$ is a relative dielectric constant of silicon;

q is a unit charge;

$N_D$ is the impurity concentration of the low doped region; and $\acute{a}$ is a factor (0<$\acute{a}$<1).

In addition, the ideal ON resistance per unit area in the ON mode can be approximately obtained by the following equation:

$$R = \acute{a}W/\grave{i}qN_D$$

wherein $\grave{i}$ is $\grave{i}$ ($N_D$) which is electron mobility at the impurity concentration of $N_D$; and W is equal to $E_c \grave{a}_o \grave{a}_{si}/q\ N_D$.

Therefore, R can be represented by the following formula:

$$R = E_c \grave{a}_o \grave{a}_{si} \acute{a}/\grave{i}q^2 N_D^2. \qquad (2)$$

Thus, if qND is removed from the formula (2) using the formula (1) and if an optimum value such as ⅔ is chosen for $\acute{a}$, the following formula results:

$$R = BV^2(27/8Ec^3 \grave{a}_o \grave{a}_{si} \grave{i}) \qquad (3)$$

In this formula, the ON resistance R seems to be proportional to the square of the breakdown voltage BV. In this case, however, the line A of FIG. 4 is roughly proportional to BV raised to the 2.4th to 2.6th power.

In the case of the n-channel type MOSFET structure where the channel type of the MOSFET of FIG. 2A is replaced, the drift current flows in the lateral direction if it is in the ON mode, while the depletion layer spreads upward (in the vertical direction) from the bottom of the well substantially faster than spreading from one end of the well in the lateral direction. For obtaining a higher breakdown voltage in the depletion layer spreading out in the vertical direction, it should be depleted from a boundary surface of the p-n junction (i.e., the bottom of the well) between the low doped drain region 14 and the channel diffusion layer 3 to a surface of the low doped drain region 14 (i.e., the surface of the well), so that the maximum value of the net doping amount in the low doped drain region 14 can be restricted by the following formula:

$$S_D = E_c \grave{a}_o \grave{a}_{si}/q \qquad (4)$$

If the length of the low doped drain region 14 is defined as L, an ideal breakdown voltage BV is represented by the formula:

$$BV = Ec\ L\hat{a} \qquad (5)$$

wherein $\hat{a}$ is a factor (0<$\hat{a}$<1)

In addition, the ideal ON resistance R per unit area in the ON mode can be approximately obtained by the following equation:

$$R = L^2/\grave{i}qS_D \qquad (6)$$

wherein $\grave{i}$ is $\grave{i}$ ($S_D$) which is electron mobility at the maximum impurity concentration of $S_D$. Thus, if L is removed from the formula (6) by substituting the formulae (4) and (5), the following formula results:

$$R = BV^2/\hat{a}^2 E_c^3 \grave{a}_o \grave{a}_{si} \grave{i} \qquad (7)$$

In the case of the vertically structured double diffusion type n-channel MOSFET shown in FIG. 2B, it is constructed by forming a p-type top layer 24 on the MOSFET structure of FIG. 2A. Therefore, the depletion layer spreads in the vertical direction, and thus the low doped drain layer 22 can be depleted quickly. As shown in the following formula (8), the net doping amount SD in the low doped region 22 can be increased twice as much as that of FIG. 2A.

$$S_D = 2E_c \grave{a}_o \grave{a}_{si}/q \qquad (8)$$

In this case, the relationship between an ideal ON resistance R and an ideal breakdown voltage of the above structure is represented by the formula:

$$R = BV^2/2\hat{a}^2 E_C^3 \grave{a}_o \grave{a}_{si} \grave{i} \qquad (9)$$

As is evident from a comparison between the above formula (7) and the above formula (9), the trade-off relationship (line B in FIG. 4) between the ON resistance and the breakdown voltage of the vertically structured n-channel type MOSFET of FIG. 2B is slightly improved over the trade-off relationship (line C in FIG. 4) between the ON resistance and the breakdown voltage of the n-channel type MOSFET where the channel type of the MOSFET of FIG. 2A is replaced. In this case, however, the improvement only permits the doping concentration twice as much as before and it does not provide flexibility in a design criterion of the current capacity and the breakdown voltage of the semiconductor.

SUMMARY OF THE INVENTION

Accordingly, it is an object of the present invention to provide a semiconductor device which relaxes the relationship between the ON resistance and the breakdown voltage to enable an increase in the current capacity by a reduction in the ON resistance under the high breakdown voltage.

It is another object of the present invention to provide a manufacturing method for rolling out semiconductor devices.

In a first aspect of present invention, there is provided a semiconductor device having a drift region where a drift current flows if it is in an ON mode and which is depleted if it is in an OFF mode, wherein the drift region is formed as a structure having a plurality of first conductive type divided drift path regions which are connected together in parallel to form a group of parallel drift paths and a plurality of second conductive type side regions, in which each of the second conductive type side regions is positioned between adjacent the first conductive type divided drift path regions to form p-n junctions.

Here, the semiconductor device may further comprise:

at least one additional second side region which is connected to an outer side of a first conductive type divided drift path region positioned at an outer side of the group of parallel drift paths.

In a second aspect of present invention, there is provided a semiconductor device having a drift region where a drift current flows if it is in an ON mode and which is depleted if it is in an OFF mode, and the drift current flows in a lateral direction and the drift region is formed on a semiconductor or an insulation film on the semiconductor, wherein the drift region is formed as a parallel stripe structure in which a plurality of stripe-shaped first conductive divided drift path regions and a plurality of stripe-shaped second conductive type compartment regions are alternatively arranged on a plane one by one in parallel.

In a third aspect of present invention, there is provided a semiconductor device having a drift region where a drift current flows if it is in an ON mode and which is depleted if it is in an OFF mode, and the drift current flows in a lateral direction and the drift region is formed on a semiconductor or an insulation film on the semiconductor, wherein the drift region is formed as a parallel stacked structure in which a plurality of layer-shaped first conductive divided drift path regions and a plurality of layer-shaped second conductive type compartment regions are alternatively stacked on a plane one by one in parallel.

In a fourth aspect of present invention, there is provided a semiconductor device having a drift region where a drift current flows if it is in an ON mode and which is depleted if it is in an OFF mode, and the drift current flows in a lateral direction and the drift region is formed on a second conductive type semiconductor, wherein the drift region comprises:

a first conductive type divided drift region formed on the second conductive type semiconductor layer;

a well-shaped second conductive type compartment region formed on the first conductive type divided drift path region; and a secondary first conductive type divided drift path region formed on a surface layer of the well-shaped second conductive type compartment region and connected to the first conductive type divided drift path region in parallel.

In a fifth aspect of present invention, there is provided a semiconductor device having a drift region where a drift current flows if it is in an ON mode and which is depleted if it is in an OFF mode, and the drift current flows in a vertical direction and the drift region is formed on a semiconductor, wherein the drift region comprises a plurality of first conductive type divided drift regions in which each of them has a layer structure along the vertical direction and a plurality of first conductive type compartment regions in which each of them has a layer structure along the vertical direction, and the plurality of first conductive type divided drift regions and the plurality of first conductive type compartment regions are stacked one by one in parallel in a direction perpendicular to the vertical direction to form a laterally stacked parallel structure.

In a sixth aspect of present invention, there is provided a method of manufacturing a semiconductor device having a drift region where a drift current flows if it is in an ON mode and which is depleted if it is in an OFF mode, and the drift current flows in a lateral direction and the drift region is formed on a second conductive type semiconductor, where the drift region has: a first conductive type divided drift region formed on the second conductive type semiconductor layer; a well-shaped second conductive type compartment region formed on the first conductive type divided drift path region; and a secondary first conductive type divided drift path region formed on a surface layer of the well-shaped second conductive type compartment region and connected to the first conductive type divided drift path region in parallel, comprising steps of:

forming a first conductive type divided drift path region on a second conductive type semiconductor layer made of silicon by a thermal diffusion after performing a phosphorus ion-implantation;

forming an well-shaped second conductive type compartment region on the first conductive type divided drift region by a thermal diffusion after performing a selective boron ion-implantation; and thermally oxidizing a structure obtained by the selective boron ion-implantation to form a secondary first conductive type divided drift path region on a surface thereof through use of a concentration of phosphorus ions which are unevenly distributed on a surface of the silicon and a dilution of boron ions which are unevenly distributed into an oxidized film.

DETAILED DESCRIPTION OF PREFERRED EMBODIMENTS

Figure 5A:
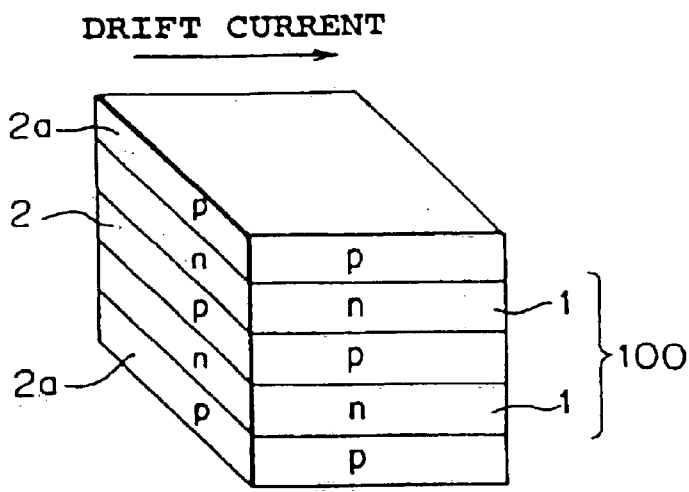
FIG. 5A is a perspective illustration of the first example of a drift region structure of a semiconductor device in accordance with the present invention.
Figure 5B:
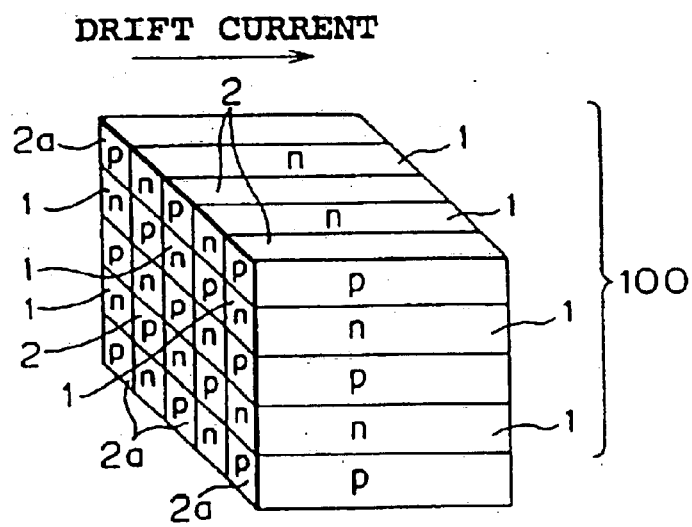
FIG. 5B is a perspective illustration of the second example of the drift region structure of the semiconductor device in accordance with the present invention.
Figure 5C:
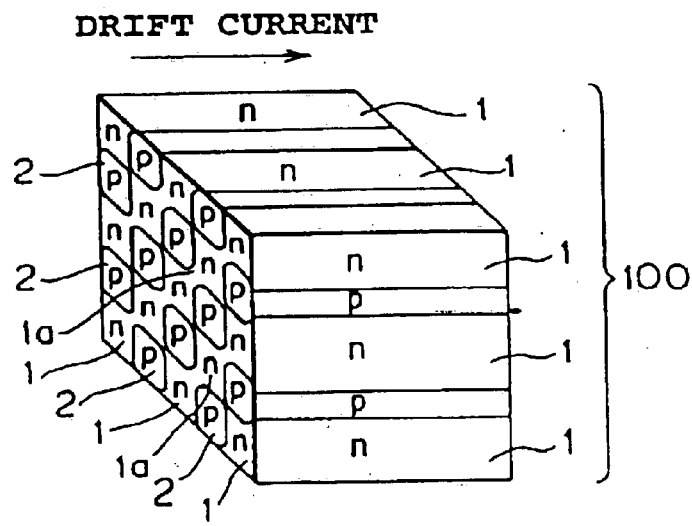
FIG. 5C is a perspective illustration of the third example of the drift region structure of the semiconductor device in accordance with the present invention.

According to the present invention, a semiconductor device has a drift region where a drift current flows in the ON mode and which is depleted in the OFF mode. The drift region is formed as a structure having a plurality of divided substructures (i.e., divided regions) in parallel, such as a layered structure, a fiber structure, or a honeycomb structure, as shown in FIGS. 5A to 5C. In addition, the drift region comprises a plurality of the first conductive type divided drift path regions 1 and a plurality of the second conductive type compartment regions 2 in which each of the regions 2 is positioned among the adjacent regions 1 to make p-n junctions.

In FIG. 5A, for example, the drift region comprises a group of parallel drift path substructures (i.e., complex structure) 100 consisting of: at least two 1st type (e.g., n-type) divided drift path regions 1 where each of them is in the shape of a plate connected to another plate in parallel at least at its one end; and at least one 2nd conductive type (e.g., p-type) compartment region 2 being sandwiched between the divided drift path regions 1,1 so as to make p-n junctions. In this figure, a plurality of 2nd type compartment regions 2 is shown. These 2nd compartment regions are connected in parallel with each other by their end portions.

The drift region shown in FIG. 5B is in the type of a multiple fiber structure. It comprises a plurality of the first conductive type (e.g., n-type) drift path regions 1 and a plurality of the second conductive type (e.g., p-type) compartment. Each region 1 or 2 is in the shape of a fiber. In a bundle of fibers (i.e., drift regions), the regions 1 and 2 are arranged so as to form a check pattern thereof in cross-section.

Furthermore, for the drift region shown in FIG. 5C, the 1st conductive type (e.g., n-type) divided drift path region 1 has connecting portions 1a in the four corners of the cross-section.

Additional 2nd conductive side regions 2a may be provided on the outermost surfaces (i.e., top and bottom surfaces) of the complex structure 100 as shown in FIG. 5A or in four corners of the complex structure 100 as shown in FIG. 5B.

If the semiconductor device is in the ON mode, a drift current flows through a plurality of the divided drift path regions 1,1 arranged in parallel. If the semiconductor device is in the OFF mode, on the other hand, a depletion layer spreads out from each p-n junction between the first conductive type divided drift region 1 and the second conductive type compartment region 2 into the region 1 to reduce the density of charge carriers therein. In this case, the depletion can be accelerated by laterally extending the outermost ends of the depletion region (i.e., the region in which there are no charge carriers) from both longitudinal sides of the second conductive compartment region, wherein the second conductive compartment region 2 is simultaneously depleted. Consequently, a breakdown voltage of the semiconductor device becomes high, so that the impurity concentration of the n-type drift path region 1 can be increased to reduce the ON resistance. Especially in the present invention, as described above, the depletion region can be widened from both longitudinal sides of the second conductive type compartment region 2 into the adjacent regions 1,1, respectively. Elongating ends of the depletion region act effectively on the respective divided drift path regions 1,1, so that the total width of the second conductive type compartment region 2 to be required for forming the depletion layer may be reduced, while the cross sectional area of the first conductive divided drift path region 1 may be increased by about the same extent, resulting in the drop in the ON resistance compared with the conventional device. Accordingly, it is preferable that the second conductive type compartment region 2 is prepared so as to have a comparatively small width thereof as much as possible. It is also preferable that the impurity concentration of the second conductive type compartment region 2 be low as much as possible.

In addition, the trade-off relationship between the ON resistance and the breakdown voltage can be eased if the number of the first conductive type divided drift path regions 1 per unit area (i.e., the number of divided regions per unit area) is increased.

In the present invention, an equation that represents the trade-off relationship between an ideal ON resistance r and a breakdown voltage BV for each of the first conductive type divided drift path regions 1 corresponds to the following formula (10) obtained by modifying the formula (9) on the assumption that the width of the second conductive compartment region 2 is infinitely small, in which the ON resistance r is N times higher than the ideal ON resistance R.

$$r = NR = BV^2 / 2\hat{a}^2 E_c^3 \hat{a}_o \hat{a}_{si} l \quad (10)$$

The relationship between an ideal ON resistance R and an ideal breakdown voltage BV of the complex structure of drift path substructures arranged in parallel can be represented by the formula:

$$R = BV^2 / 2N\hat{a}^2 E_c^3 \hat{a}_o \hat{a}_{si} l \quad (11)$$

Therefore, the possibility of manufacturing a semiconductor device having a considerably low ON resistance can be increased in a direct proportional relationship with the number of the divided drift regions.

In much the same fashion as a lateral type semiconductor device formed on a silicon-on-insulator (SOI) or a semiconductor layer, a lateral type semiconductor device having a drift region formed on a semiconductor layer or on an insulation film on the semiconductor layer, in which a drift current flows in the drift region in the lateral direction if it is in the ON mode and mobile charges are depleted if it is in the OFF mode. The drift region can be fabricated as a stripe structure by alternately arranging the respective first conductive type divided drift path regions in the shape of a stripe and the respective second conductive type compartment regions in the shape of a stripe on a plane. The stripe shaped p-n junction repeated structure on the plane may be formed by performing a photolithography one time, resulting in a simple manufacturing process and—a low production cost for the semiconductor device.

Another structure of the drift region to be formed in the lateral type semiconductor device may be a superposed parallel structure by alternatively laminating the respective first conductive type divided drift path region in the shape of a flat layer and the respective second conductive type compartment region in the shape of a flat layer. The thickness of each layer can be precisely decreased as much as possible using a metal organic chemical vapor deposition (MOCVD) or a molecular beam epitaxy (MBE), so that the trade-off relationship between the ON resistance and the breakdown voltage can be substantially eased.

By the way, it may be possible to prepare the drift region as the superposed structure with the striped parallel structure.

If N=2 in the above formula (10) or (11), the complex structure of parallel drift paths is made of two stripe-shaped divided drift path regions. Thus the most simple drift region of the lateral type semiconductor device comprises a first conductive type divided drift path region formed on a second conductive type semiconductor layer, a well-shaped second conductive type compartment region formed on the first conductive type divided drift path region, another first conductive type divided drift path region formed on a surface layer of the second conductive type compartment region and connected to the first conductive type divided drift path region. The ON resistance of the semiconductor device can be reduced by connecting the another first conductive type divided drift path region with the first conductive type divided drift path region in parallel.

A method for fabricating the above simple lateral type semiconductor comprises the steps of: forming a first n-type divided drift path region on a p-type semiconductor layer on a silicon layer by a thermal diffusion after performing a phosphorus ion-implantation; forming a well-shaped p-type compartment region on the first n-type divided drift path region by a thermal diffusion after performing a selective boron ion-implantation; thermally oxidizing the obtained layer structure to form a second n-type divided drift path region on a surface thereof through the use of concentrated phosphorus ions which are unevenly distributed on a surface of the silicon and of diluted boron ions which are unevenly distributed into the oxidized film.

There is no reverse conductive type layer adjacent to the top layer of the second n-type divided drift path region. Hence, it is enough to provide a thin layer to readily deplete the second n-type divided drift path region. The fabrication method of the present invention does not require the step of doping impurities. Further, the second n-type divided drift region is provided only by the step of the thermal oxidation, which contributes to reduced cost and a reduced number of steps for providing a way for the practical mass production of semiconductor devices.

Furthermore, another semiconductor device according to the present invention has a drift region formed on a semiconductor layer, in which the drift region feeds a drift current in the vertical direction if the device is in the ON mode and the drift region is depleted if the device is in the OFF mode. Exemplary devices include vertical type semiconductor devices including a semiconductor using a trench gate or the like and IGBT. The drift region comprises a plurality of first conductive type divided drift path regions and a plurality of second conductive compartment regions, in which each region is in the shape of a layer in the vertical direction. The respective first conductive type divided drift path regions and the respective second conductive type compartment regions are alternatively laminated in parallel in the lateral direction. In the process for fabricating this structure, an etching step can be required for forming a deep groove. In this case, however, it is also possible to substantially ease the trade-off relationship between the ON resistance and the breakdown voltage of the vertical type semiconductor device.

Embodiment 1

Figure 6A:
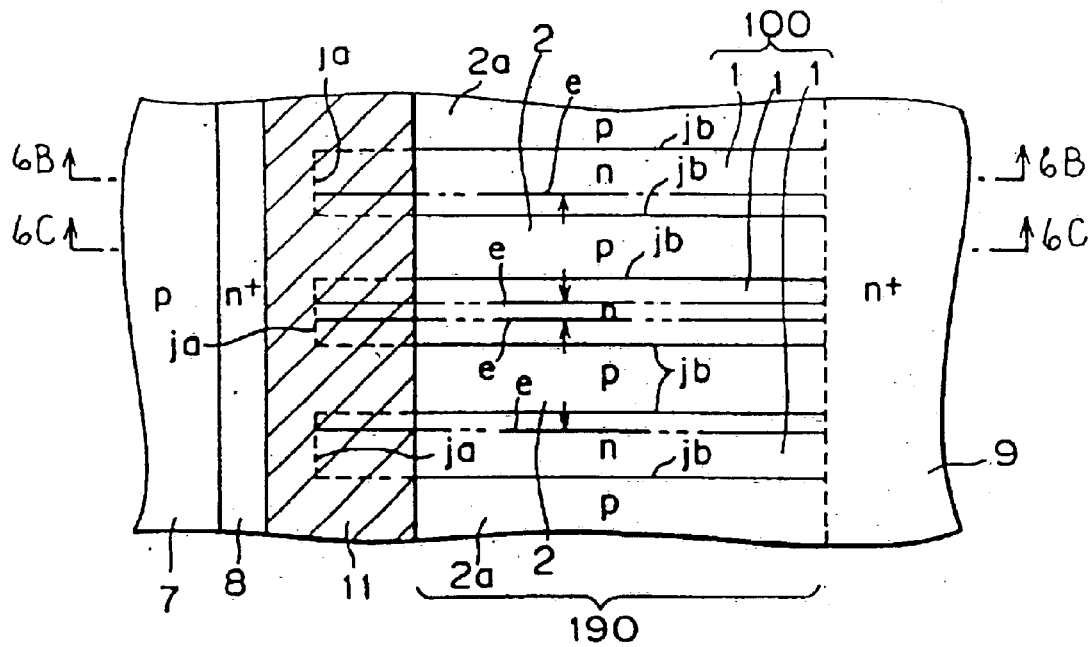
FIG. 6A is a plan view showing a SOI-MOSFET in the type of vertically structured as the first preferred embodiment of the semiconductor device in accordance with the present invention.
Figure 6B:
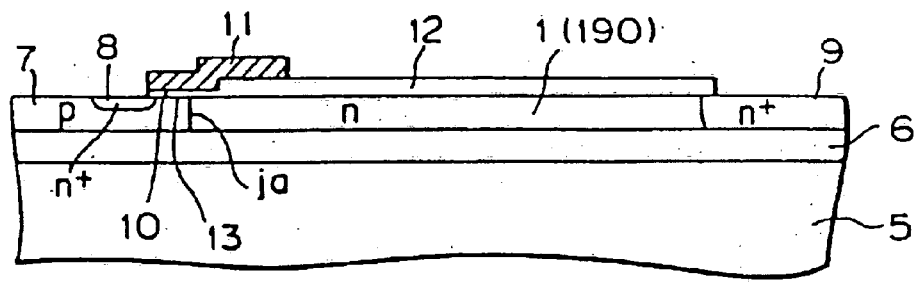
FIG. 6B is a cross sectional view taken along line 6B—6B in FIG. 6A.
Figure 6C:
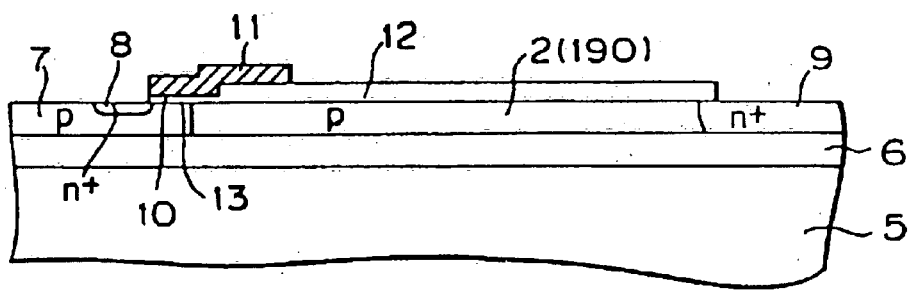
FIG. 6C is a cross sectional view taken along line 6C—6C in FIG. 6A.

Referring now to FIGS. 6A to 6C, a silicon-on-insulator (SOI) metal oxide semiconductor field-effect transistor (MOSFET) in the type of a lateral structure (hereinafter, referred as a lateral SOI MOSFET) will be described in detail as a first preferred embodiment of the present invention. In these figures, FIG. 6A is a plan view of the lateral SOI-MOSFET, FIG. 6B is a cross sectional view along a line 6B—6B in FIG. 6A, and FIG. 6C is a cross sectional view along a line 6C—6C in FIG. 6A.

Figure 1A:
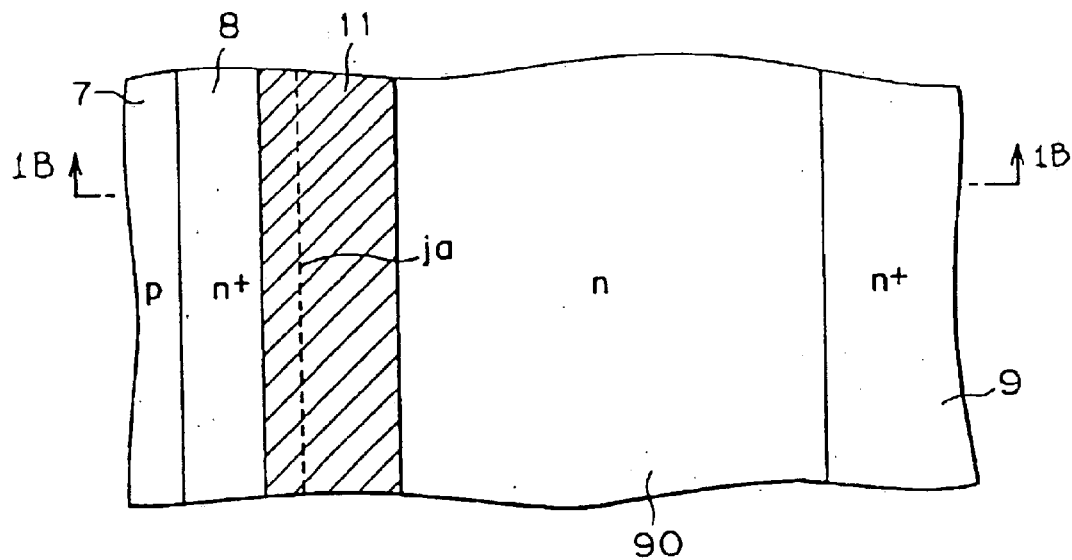
FIG. 1A is a plan view showing an example of the conventional SOI-MOSFET which is vertically structured.
Figure 1B:
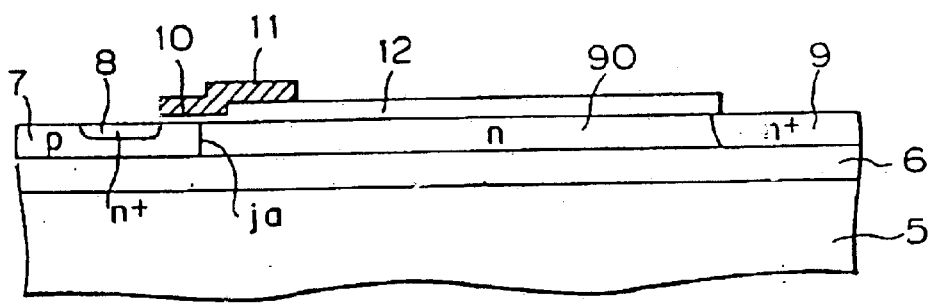
FIG. 1B is a cross sectional view taken along line 1B—1B in FIG. 1A.

The lateral SOI-MOSFET of the present embodiment has the same structure as the offset gate structure of the n-channel MOSFET shown in FIGS. 1A and 1B except in the structure of drain/drift region.

A structure of the lateral SOI-MOSFET comprises a p-type channel diffusion layer 7 formed on an insulation film 6 on a semiconductor substrate 5, a gate electrode 11 with a field plate formed on the channel diffusion region 7 via an insulation film 10, an n$^+$-type source region 8 formed on a portion of the channel diffusion layer 7 where the portion is on the side of one end of the gate electrode 11, an n$^+$-type drain region 9 formed on a position at a predetermined distance from the other end of the gate electrode 11, a drain/drift region 190 which is extended between the diffusion region 7 and the drain region 9, and a thick insulation film 12 formed on the drain/drift region 190.

The drain/drift region 190 of the present embodiment consists of a plurality of divided regions in the shape of a stripe: n-type drift path regions 1 and p-type compartment regions 2, which are alternately arranged in parallel on a plane to form a parallel stripe structure. One end of each n-type drift path region 1 is connected to the p-type channel diffusion region 7 to form a p-n junction, while the other end thereof is connected to the n$^+$-type drain region 9. Thus the n-type path regions 1 arranged in parallel form a drift path group 100 branched off from the n$^+$-type drain region 9. In addition, as shown in the figure, there is a p-type semiconductor region 2a adjacent to a longitudinal side of the drift region 1 positioned at each side of the drift path group, and also each of the drift regions 1 is sandwiched between p-type semiconductor regions 2 (2a). Furthermore, one end of each p-type semiconductor is connected to the p-type channel diffusion region 7, while the other end thereof is connected to the n$^+$-type drain region 9 to form a p-n junction. Therefore, the respective p-type compartment regions 2 are branched off from the p-type channel diffusion region 7 and form parallel connection with the respective n$^+$-type drain regions 9.

If the lateral SOI-MOSFET is in the ON mode, carriers (electrons) flow from the n$^+$-type source region 8 into a plurality of the n-type drift path regions 1 through a channel inversion layer directly below the gate insulation film 10 to cause a drift current by an electric field generated by voltage placed between the drain and the source. If it is in the OFF mode, on the other hand, the channel inversion layer 13 directly below the gate insulation film 10 disappears. Further, a depletion layer is widened from the p-n junction ja between the n-type drift path region 1 and the p-type channel diffusion region 7, and a depletion layer is widened from the p-n junction jb between the n-type drift path region 1 and the p-type compartment region 2 into the n-type drift path region 1, resulting in a depletion of the n-type drift path region 1. In this case, one end of the depletion layer is widened from the p-n junction ja along a path length in the n-type drift path region 1 and the other end thereof is widened from the p-n junction jb along a path width in the n-type drift path region 1. That is, the depletion layer is widened from both sides to accelerate the depletion. Therefore, the electric field strength is weakened and the breakdown voltage becomes high, so that the concentration of impurities in the respective n-type drift path regions 1 may be increased. In this embodiment, particularly, the ends of the depletion are extended from both of the longitudinal sides of the p-type compartment region 2 into the adjacent n-type drift path regions 1, 1, respectively, and thus the total width of the p-type compartment regions 2 can be reduced in half, while the cross sectional area of the n-type drift path region 1 can be increased. This results in the drop in the ON-resistance in comparison with that of the conventional device. In addition, the trade-off relationship between the ON resistance and the breakdown voltage is extensively weakened as the number N of the n-type drift path region 1 per unit area is increased. It is preferable that the width of the p-type compartment regions 2 is as small as possible.

For the sake of clarity, the ON resistance R of the lateral SOI-MOSFET of the present embodiment will be compared with that of the conventional one under the following condition: the ideal breakdown voltage BV=100 V; the concentration of impurities in the first n-drift path region 1 $N_D=3\times10^{15}$ (cm$^3$); the maximum electric field strength of silicon $E_c=3\times10^5$ (V/cm); the mobility of electron ì=1,000 (cm$^2$/V·sec); the dielectric constant of vacuum à$_o$=8.8×10$^{-12}$ (C/Vm); the relative dielectric constant of silicon à$_{si}$=12; and the unit charge q=1.6×10$^{-19}$ (C).

In the case of the lower doping drain region 90 of the conventional device shown in FIG. 1A, the ideal ON resistance R is 9.1 (m·ohm·cm$^2$) using the equations described above if the region 90 has the length of 6.6 ìm and the thickness of 1 ìm. In the case of the present embodiment, on the other hand, the ideal ON resistance R is dramatically dropped when the width W of each of the n-type drift path region 1 and the p-type compartment region 2 is less than 1 ìm. That is, R=7.9 (m·ohm·cm$^2$) when W=10 ìm; R=0.8 (m·ohm·cm$^2$) when W=1 ìm; and R=0.08 (m·ohm·cm$^2$) when W=0.1 ìm if the length thereof is 5 ìm, and a is ⅔. If the width of the p-type compartment region 2 is slightly larger than that of the n-type drift path region 1, a noticeable improvement in the ideal ON resistance R can be further obtained. For the mass-production of semiconductor devices, by the way, it is difficult to obtain the width of each region 1 or 2 less than 0.5 ìm by means of photolithography and ion-implantation at the present time. In the near future, however, further reduction in the ON resistance of the lateral SOI-MOSFET of the present embodiment will be achieved by lessening the width of each region 1 or 2 less than 0.5 ìm as micro-machining technology progresses.

The structure of the drift region to be applied in the present embodiment is repeated p-n junctions of stripes on a plane, so that the structure can be processed by a single step of photolithography for a simplification of the manufacturing process to provide chips at the lowest cost.

Embodiment 2

Figure 7A:
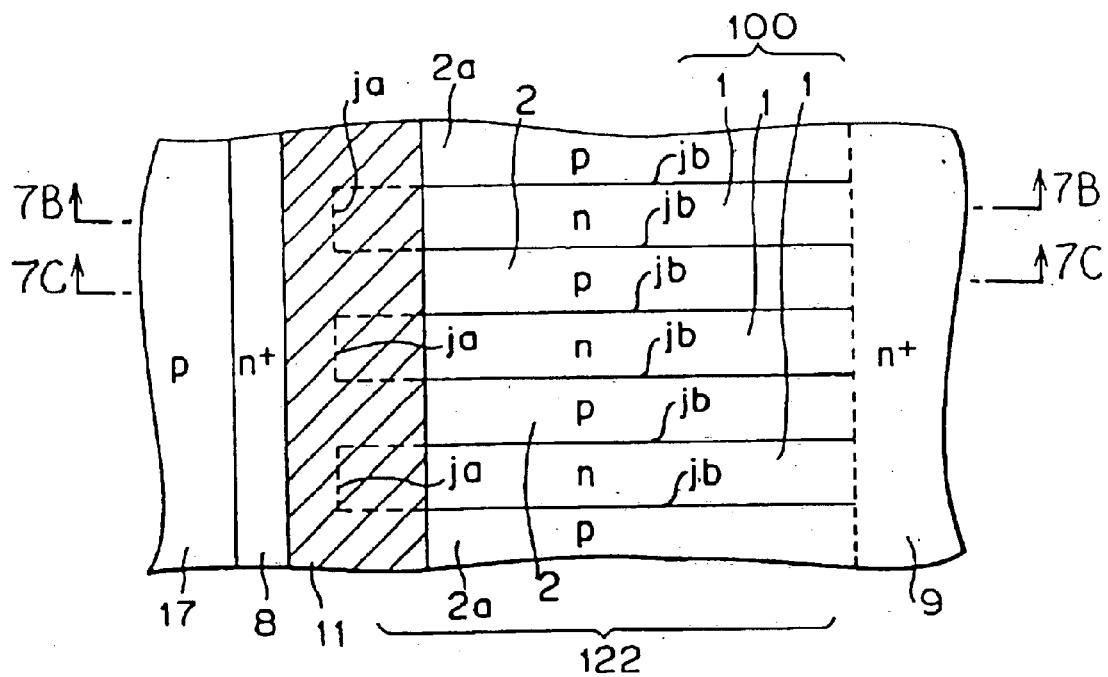
FIG. 7A is a plan view showing a SOI-MOSFET in the type of double diffusion as the second preferred embodiment of the semiconductor device in accordance with the present invention.
Figure 7B:
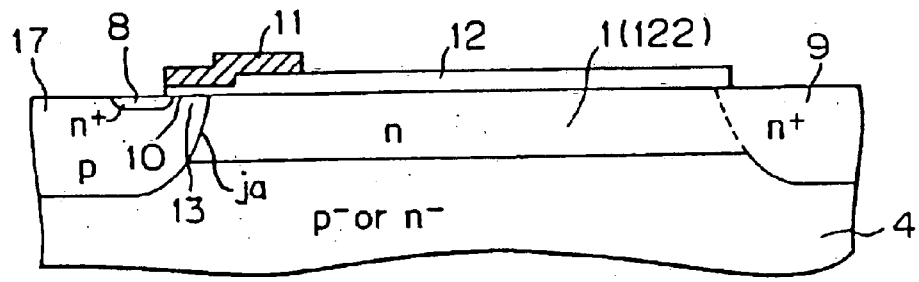
FIG. 7B is a cross sectional view taken along line 7B—7B in FIG. 7A.
Figure 7C:
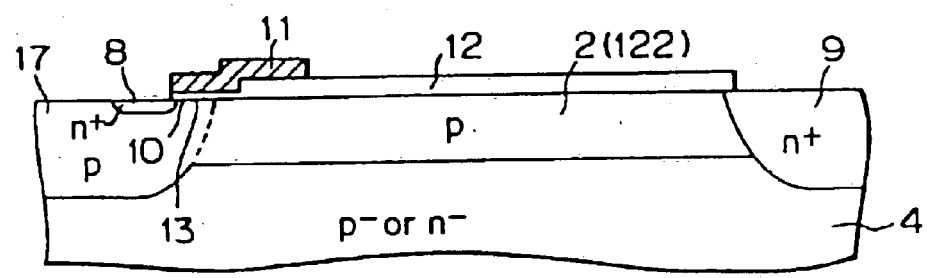
FIG. 7C is a cross sectional view taken along line 7C—7C in FIG. 7A.

Referring now to FIGS. 7A to 7C, a double diffused type n-channel MOSFET (hereinafter, also referred as a double diffused MOSFET) will be described in detail as a second preferred embodiment of the present invention. In these Figures, FIG. 7A is a plan view showing the double diffused MOSFET, FIG. 7B is a cross sectional view along a line 7B—7B in FIG. 7A, and FIG. 7C is a cross sectional view along a line 7C—7C in FIG. 7A.

Figure 2A:
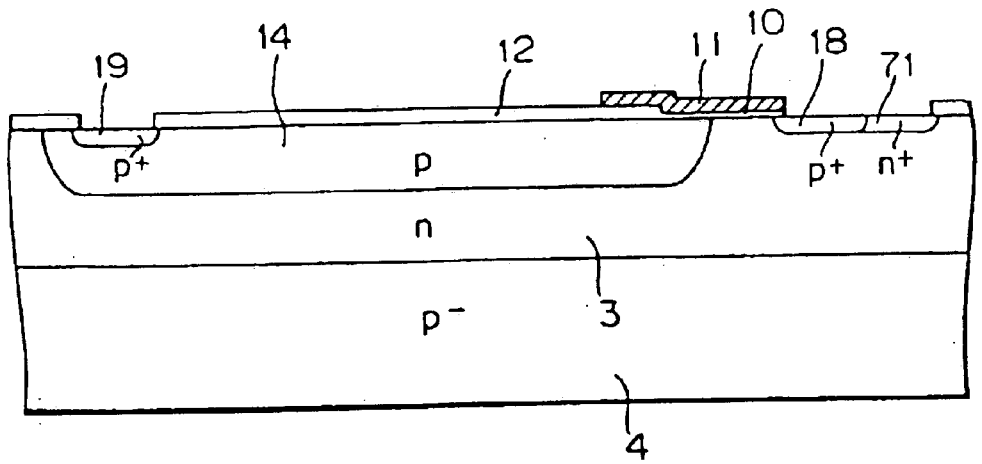
FIG. 2A is a cross sectional view showing another example of the conventional MOSFET which is vertically structured.
Figure 2B:
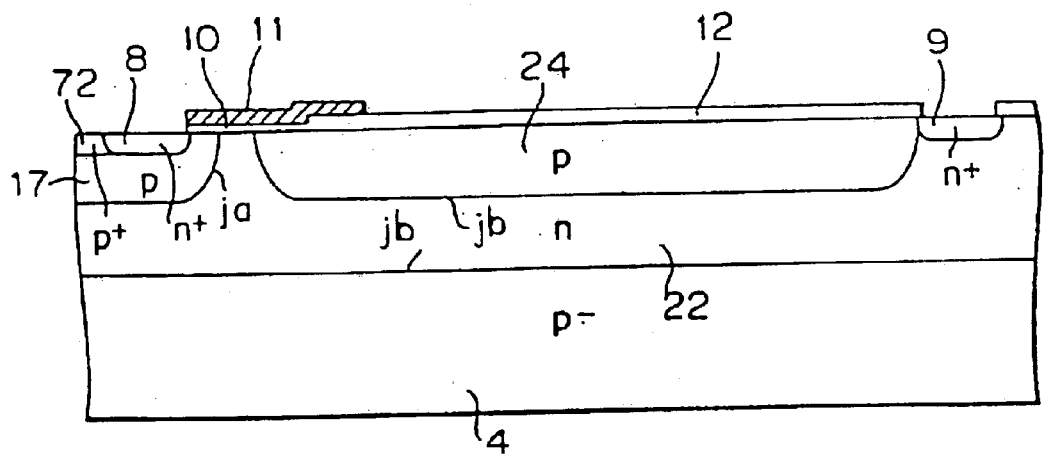
FIG. 2B is a cross sectional view showing an example of the conventional n-channel MOSFET in the type of double diffusion.

The double diffused MOSFET of the present embodiment has the same structure as the conventional double diffused MOSFET shown in FIGS. 2A and 2B except in the structure of drain/drift region. As shown in the figure, the double diffused MOSFET of the present embodiment comprises a drain/drift region 122 formed on a p$^-$-type or n$^-$-type semiconductor layer 4, a gate electrode 11 with a filed plate formed on the drain/drift region 122 through a gate insulation film 10, a p-type channel diffusion region 17 in the shape of a well formed on a portion of the semiconductor layer 4 where the portion is at one end of the gate electrode 11, an n$^+$-type source region 8 in the shape of a well formed in the p-type channel diffusion region 17, an n$^+$-type drain region 9 formed on a position at a predetermined distance from the other end of the gate electrode 11, a drain/drift region 122 which is extended between the p-type channel diffusion region 17 and the n⁺-type drain region 9, and a thick insulation film 12 formed on the drain/drift region 122.

The drain/drift region 122 of the present embodiment consists of a plurality of divided regions shaped as stripes, in the same way as the first preferred embodiment shown in FIGS. 6A to 6C: n-type drift path regions 1 and p-type compartment regions 2, which are alternately arranged in parallel on a plane to form a parallel stripe structure. One end of each n-type drift path region 1 is connected to the p-type channel diffusion region 17 to form a p-n junction, while the other end thereof is connected to the n⁺-type drain region 9. Thus, the n-type path regions 1 arranged in parallel form a drift path group 100 branched off from the n⁺-type drain region 9. In addition, as shown in the figure, there is a p-type semiconductor region 2a adjacent to a longitudinal side of the drift region 1 positioned at each side of the drift path group, and also each of the drift regions 1 is sandwiched between p-type semiconductor regions 2, 2a. Furthermore, one end of each p-type semiconductor is connected to the p-type channel diffusion region 17, while the other end thereof is connected to the n⁺-type drain region 9 to form a p-n junction. Therefore, the respective p-type compartment regions 2 are branched off from the p-type channel diffusion region 17 and form parallel connections with the respective n⁺-type drain regions 9.

If the double diffused MOSFET is in the OFF mode, just like the first embodiment, the channel inversion layer 13 directly below the gate insulation film 10 disappears. Further, a depletion layer is widened from the p-n junction ja between the n-type drift path region 1 and the p-type channel diffusion region 7, and a depletion layer is widened from the p-n junction jb between the n-type drift path region 1 and the p-type compartment region 2 into the n-type drift path region 1, resulting in a depletion of the n-type drift path region 1. In this case, one end of the depletion layer is widened from the p-n junction jb along a path length in the n-type drift path region 1 and the other end thereof is widened from the p-n junction jb along a path width in the n-type drift path region 1. That is, the depletion layer is widened from both sides to accelerate the depletion. Therefore, the breakdown voltage becomes high, so that the concentration of impurities in the respective n-type drift path regions 1 may be increased to drop in the ON resistance.

For the sake of clarity, the ON resistance R of the double diffused MOSFET of the present embodiment will be compared with that of the conventional one shown in FIG. 2B under the same conditions as that of the first embodiment at the ideal breakdown voltage BV=100 V. In the case of the conventional device shown in FIG. 2B, the ideal ON resistance R is about 0.5 (m·ohm·cm²). In the case of the present embodiment, on the other hand, the ideal ON resistance R is 0.4 (m·ohm·cm²), if each of the drift path region 1 and the compartment region 2 has a thickness of 1 mm and a width of 0.5 ìm. It is possible to drop the ON resistance extensively by further narrowing a width of each region 1 or 2. Alternatively, it is also possible to drop the ON resistance extensively by enlarging a resistance cross-section of the drift path region 1 by thickening the respective drift path regions 1 and the respective p-type compartment region 2. For example, the ON resistance R can be 1/10 of the conventional one if a thickness of the region 1 or 2 is 10 ìm and it can be 1/100 of the conventional one if a thickness of the region 1 or 2 is 100 ìm. For the doping into such a thickened region, an impurity ion-implantation with a plurality of energy levels (or successive energy levels) may be performed on the same portion of the thickened region.

Embodiment 3

Figure 8A:
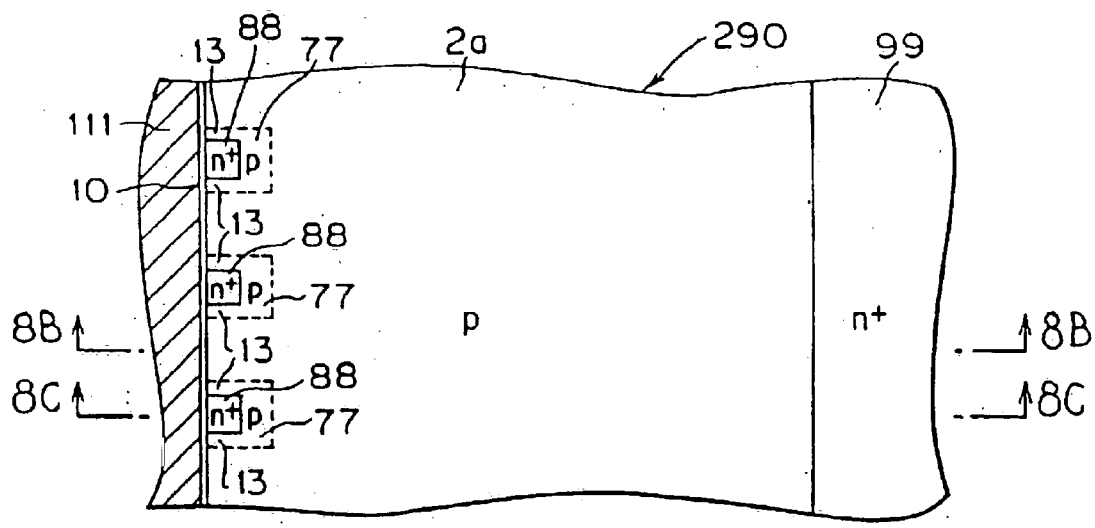
FIG. 8A is a plan view showing a SOI-MOSFET in the type of vertically structured as the third preferred embodiment of the semiconductor device in accordance with the present invention.
Figure 8B:
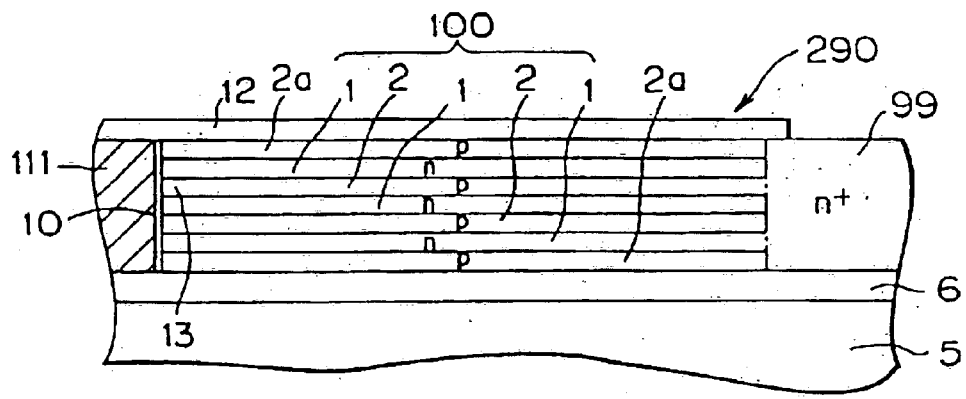
FIG. 8B is a cross sectional view taken along line 8B—8B in FIG. 8A.
Figure 8C:
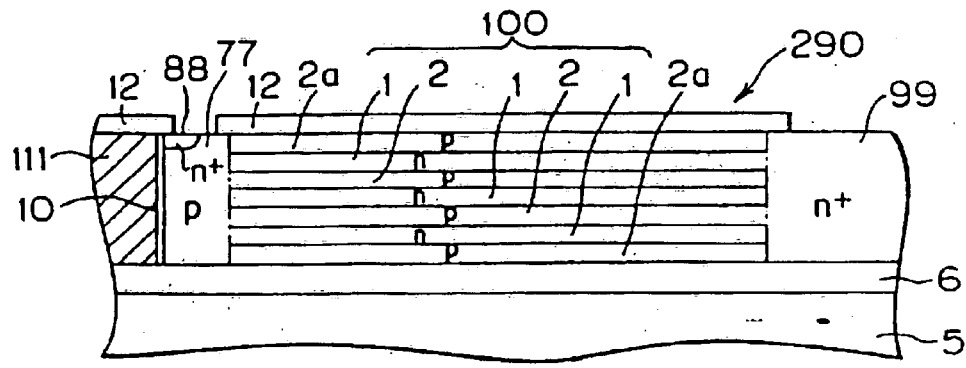
FIG. 8C is a cross sectional view taken along line 8C—8C in FIG. 8A.

FIGS. 8A to 8C show a lateral SOI-MOSFET as a third preferred embodiment of the present invention. In these figures, FIG. 8A is a plan view of the lateral SOI-MOSFET, FIG. 8B is a cross sectional view along a line 8B—8B in FIG. 8A, and FIG. 8C is a cross sectional view along a line 8C—8C in FIG. 8A.

The lateral SOI-MOSFET of the present embodiment comprises a p-type channel diffusion layer 77 formed on a semiconductor substrate 5 through an insulation layer 6, a trench gate electrode 111 formed on the p-type channel diffusion layer 77 through a gate insulation film 10, a plurality of n⁺-type source regions 88 formed in the top side of the p-type channel diffusion layer 77 and adjacent to an upper edge of the trench gate electrode 111, an n⁺-type drain region 99 formed on a position at a predetermined distance from the gate electrode 111, a drain/drift region 290 which is extended between the drain region and the gate electrode; and a thick insulation film 12 formed on the drain/drift region 290.

The drain/drift region 290 of the present embodiment, as distinct from that of the first embodiment, is provided as a stacked layer structure in which the respective n-type drift path regions 1 and the respective p-type compartment regions 2 are alternately stacked in parallel, repeatedly. In this case, each of these regions 1, 2 is in the shape of a plate. As shown in the figure, an additional p-type compartment region 2a is positioned as a bottom end region of the drain/drift region 290 at the side of the bottom n-type drift path region 1, and also another additional p-type compartment region 2a is positioned as a top end region of the drain/drift region 290 at the side of the top n-type drift path region 1. A net doping concentration of each of the regions 2a is less than 2×10¹²/cm². One end of each of the respective n-type drift path regions 1 is connected to the p-type channel diffusion layer 77 to form a p-n junction, while the other end thereof is connected to the n⁺-type drain region 99. Thus the n-type drift path regions 1 arranged in parallel form a drift path group 100 which is branched off from the n⁺-type drain region 99. In addition, as shown in the figure, one end of each of the p-type compartment regions 2 is connected to the p-type channel diffusion layer 77, while the other end thereof is connected to the n⁺-type drain region 99 to form a p-n junction. Thus, the p-type compartment regions 2 are branched off from the p-type channel diffusion layer 77 and arranged in a parallel connection.

In this embodiment, furthermore, an ideal ON resistance of the lateral SOI-MOSFET can be calculated by the formula (11) described above. In this case, N is the number of the stacked n-type drift path regions 2. If the ideal breakdown voltage is 100 V, the ideal ON resistance R is 0.5 (m·ohm·cm²) for the conventional structure (N=1) but 0.05 (m·ohm·cm²) for the present structure (N=10). It means that the ON resistance R is substantially dropped in inverse proportion to the number N of divided regions 1.

As described above, basic technologies for fabricating the structures shown in FIGS. 6A to 6C and FIGS. 7A to 7C are photolithography and ion implantation. In this embodiment shown in FIGS. 8A to 8C, on the other hand, a crystal growth technique is used because the plate-shaped regions 1, 2 should be stacked in alternate order. A total thickness of the whole regions 1, 2 and a period of performing the crystal growth are increased in proportionate to the number of the regions 1, 2 to be stacked. Thus, an unequal distribution of the impurities cannot be ignored because the impurities tend to diffuse in the respective thicken regions. Preferably, a thickness of each regions 1, 2 should be reduced as much as possible to perform the crystal growth at a low temperature enough to ignore the unequal distribution. Comparing with an epitaxial growth heavily used in the conventional silicon-processing technologies, it is preferable to use a metal organic chemical vapor deposition (MOCVD) and a molecular beam epitaxy (MBE), which are generally applied in the fabrication of compound semiconductors such as a gallium arsenide semiconductor, in the present embodiment. These techniques can be provided as micro-machining techniques which contribute to reduce the ON resistance by an effect of thinning the plate-shaped n-type drift path regions 1 and the plate shaped p-type compartment regions 2.

In this embodiment, by the way, the difficulty of forming a channel inversion layer 13 is increased if the concentration of impurities is increased by thinning those regions 1, 2. Consequently, it is difficult to drop the ON resistance because of the difficulty of lowering the channel resistance. To solve this problem, it is preferable to make a low concentrated area on a part of the region where the gate insulation membrane 10 touches one of the n-type drift regions 1 and the p-type compartment regions 2.

Embodiment 4

Figure 9A:
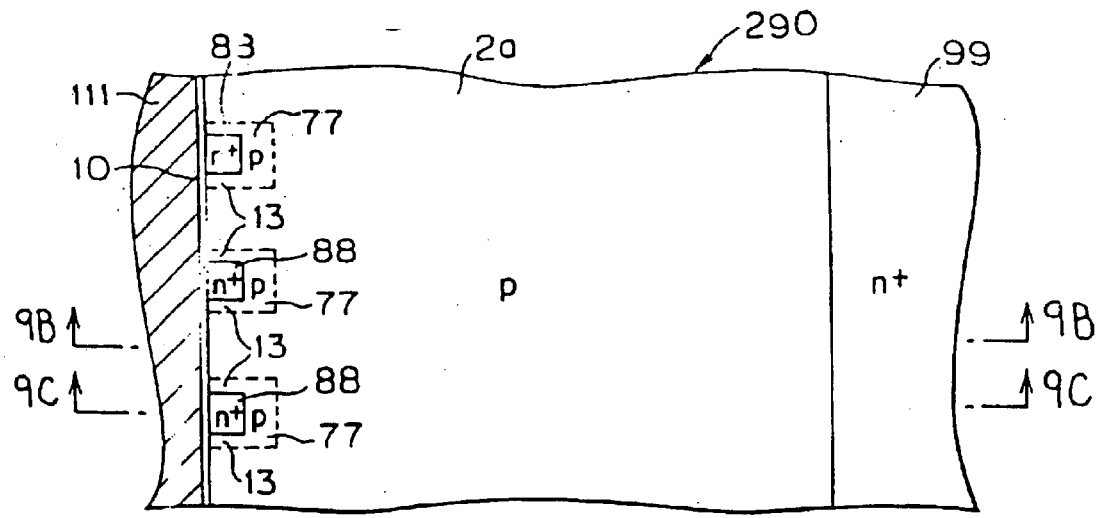
FIG. 9A is a plan view showing a MOSFET in the type of vertically structured as the fourth preferred embodiment of the semiconductor device in accordance with the present invention.
Figure 9B:
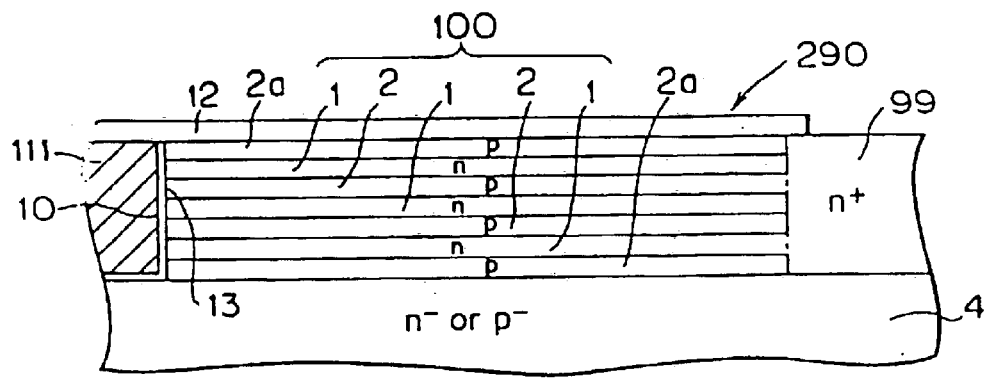
FIG. 9B is a cross sectional view taken along line 9B—9B in FIG. 9A.
Figure 9C:
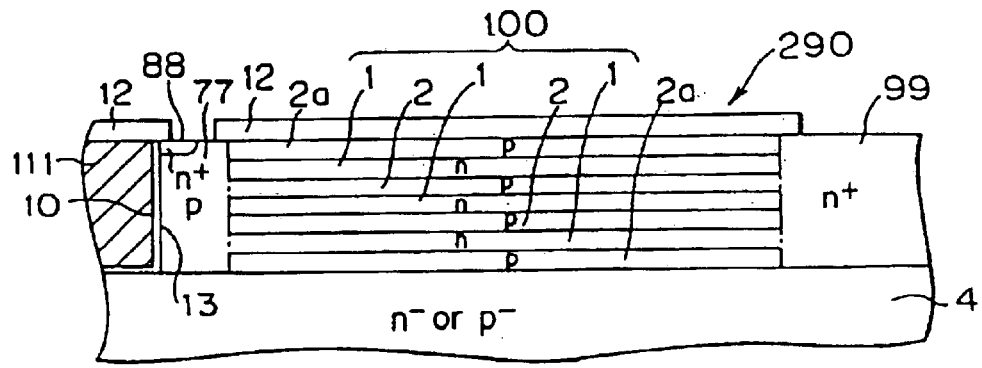
FIG. 9C is a cross sectional view taken along line 9C—9C in FIG. 9A.

Referring now to FIGS. 9A to 9C, a lateral MOSFET will be described in detail as a fourth preferred embodiment of the present invention. In these figures, FIG. 9A is a plan view showing the lateral MOSFET, FIG. 9B is a cross sectional view along a line 9B—9B in FIG. 9A, and FIG. 9C is a cross sectional view along a line 9C—9C in FIG. 9A.

The lateral MOSFET of the present embodiment comprises a p-type channel diffusion layer 77 formed on a p$^-$- or n$^-$-type semiconductor substrate 4, a trench gate electrode 111 formed on a side wall of the p-type channel diffusion layer 77 through a gate insulation film 10, a plurality of n$^+$-type source regions 88 formed in the top end of the p-type channel diffusion layer 77 and adjacent to an upper edge of the trench gate electrode 111, a n$^+$-type drain region 99 formed on a position at a predetermined distance from the gate electrode 111, a drain/drift region 290 which is extended between the drain region and the gate electrode; and a thick insulation film 12 formed on the drain/drift region 290.

The drain/drift region 290 of the present embodiment, as the same as that of the third embodiment, is provided as a stacked layer structure in which the respective n-type drift path regions 1 and the respective p-type compartment regions 2 are alternately stacked in parallel, repeatedly. In this case, each of these regions 1, 2 is in the shape of a plate. As shown in the figure, an additional p-type compartment region 2a is positioned as a bottom end region of the drain/drift region 290 at the side of the bottom n-type drift path region 1, and also another additional p-type compartment region 2a is positioned as a bottom end region of the drain/drift region 290 at the side of the to p-n-type drift path region 1. A net doping concentration of each of the regions 2a is less than $2\times10^{12}/cm^2$. One end of each of the respective n-type drift path regions 1 is connected to the p-type channel diffusion layer 77 to form a p-n junction, while the other end thereof is connected to the n$^+$-type drain region 99. Thus the n-type drift path regions 1 arranged in parallel form a drift path region group 100 which is branched off from the n$^+$-type drain region 99. In addition, as shown in the figure, one end of each of the p-type compartment regions 2 is connected to the p-type channel diffusion layer 77, while the other end thereof is connected to the n$^+$type drain region 99 to form a p-n junction. Thus the p-type compartment regions 2 are branched off from the p-type channel diffusion layer 77 and arranged in a parallel connection.

In this embodiment, as in the case of the third embodiment, it is possible to reduce the ON resistance and to increase the breakdown voltage. The relationship between the structure of the present embodiment and that of the third embodiment shown in FIGS. 8A to 8C corresponds to the relationship between the second embodiment shown in FIGS. 7A to 7C and the first embodiment shown in FIGS. 6A to 6C. That is, the structure of the present invention is not of SOI, so that it is possible to fabricate the semiconductor device at a low cost.

Embodiment 5

Figure 10:
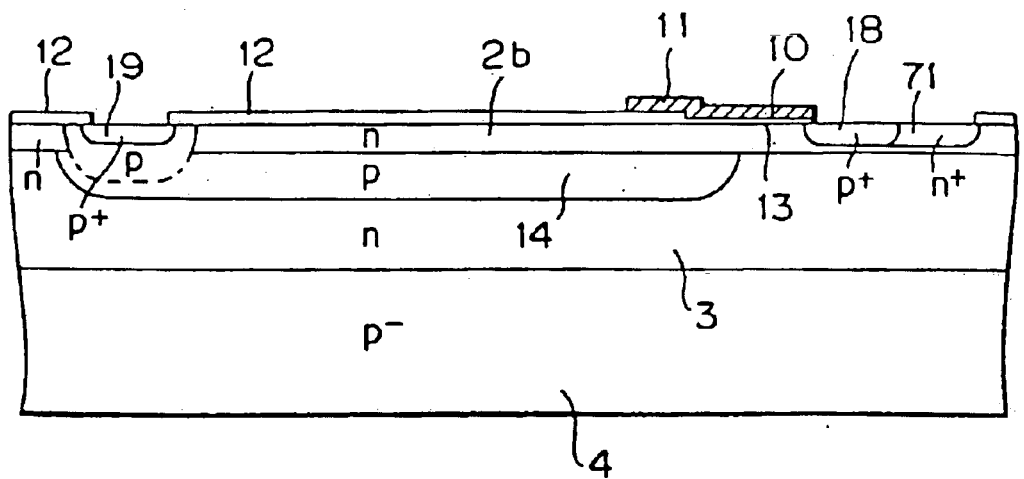
FIG. 10 is a cross sectional view showing a p-channel MOSFET in the type of vertically structured as the fifth preferred embodiment of the semiconductor device in accordance with the present invention.

FIG. 10 is a cross sectional view of a lateral p-channel MOSFET as a fifth preferred embodiment of the present invention, corresponding to that of FIG. 2A except for the drain/drift region.

The lateral p-channel MOSFET of the present embodiment comprises a n-type channel diffusion layer 3 formed on a p$^-$-type semiconductor layer 4, a gate electrode 11 with a field plate formed on the n-type channel diffusion layer 3 through a gate insulation film 10, a p$^+$-type source region 18 in the shape of a well formed on a portion of the n-type channel diffusion region 3 where the portion is at one end of the gate electrode 11, a p-type drain/drift region 14 in the shape of a well formed in the n-type channel diffusion region 3 where a portion of the region 14 is directly below the other end of the gate electrode 11, a n-type compartment region 2b provided as a top side region formed on a surface of the p-type drain/drift region 14, a p$^+$-type drain region 19 formed on a position at a predetermined distance from the other end of the gate electrode 11, an n$^+$-type contact region 71 adjacent to the p$^+$-type source region 18, and a thick insulation film 12 formed on the p-type drain/drift region 14. In this embodiment, the number of divided drain regions N is one (1), so that the p-type drain/drift region 14 corresponds to a stripe of the drain path region 1 in the cross sectional view. A thickness of the n-type top side region 2b on the p-type drain/drift region 14 is formed as a thin film for the purpose of expediting the depletion. Comparing this embodiment with the structure of FIG. 2A, the n-type top side region 2b is provided in the present structure for accelerating the depletion by providing a depletion layer from the n-type channel diffusion layer 3 under the p-type drain/drift region 14 and another depletion layer from the n-type top side region 2b above the p-type drain/drift region 14. The net doping concentration of the drain/drift region 14 of the conventional structure shown in FIG. 2A is approximately $1\times10^{12}/cm^2$, while the structure of the present invention has the net doping concentration of approximately $2\times10^{12}/cm^2$ which is more than twice as much as that of the conventional one. According to the present embodiment, therefore, it is possible to reduce the ON resistance as a result of increasing the concentration of impurities in the drain/drift region, and it is possible to increase the breakdown voltage.

Embodiment 6

Figure 11:
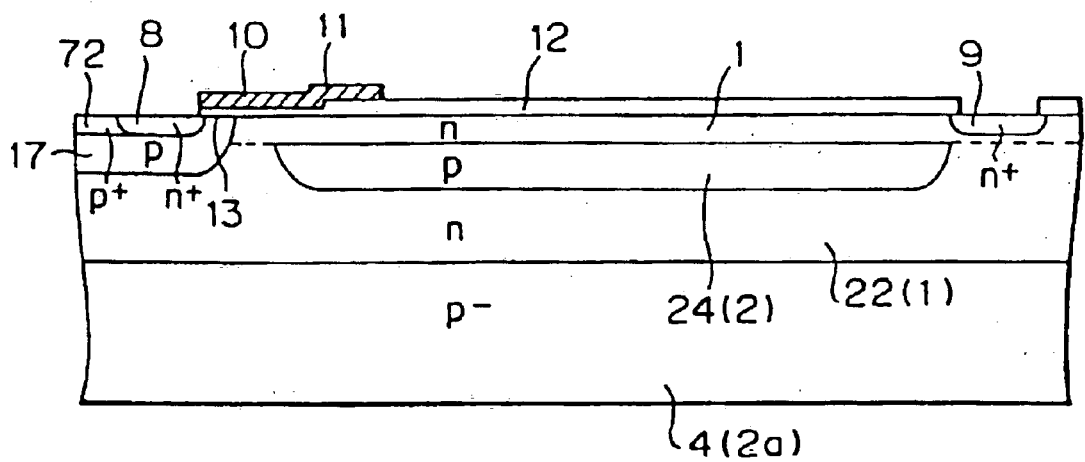
FIG. 11 is a cross sectional view showing an n-channel MOSFET in the type of vertically structured as the sixth preferred embodiment of the semiconductor device in accordance with the present invention.

FIG. 11 is a cross sectional view showing a double diffused n-channel MOSFET in the type of a lateral structure (hereinafter, simply referred as a double diffused MOSFET) as a sixth preferred embodiment of the present invention, corresponding to that of FIG. 2B except for the drain/drift region.

The double diffused MOSFET comprises a drain/drift region 22 (i.e., a first n-type drift path region 1) formed on a p-type semiconductor layer 4 (i.e., a p-type bottom side region 2a), a gate electrode 11 with a field plate formed on the drain/drift region 22 through a gate insulation film 10, a p-type channel diffusion region 17 in the shape of a well formed on a portion of the drain/drift region 22 where the region 17 is positioned at one end of the gate electrode 11, an n+-type source region 8 in the shape of a well formed in the p-type channel diffusion region 17, a p-type top layer 24 (i.e., a p-type compartment region 2) formed on a surface layer between the gate electrode 11 and the n+-type drain region 9 positioned at a predetermined distance from the gate electrode 11, a second n-type drift path region 1 formed on a surface of the p-type compartment region 2, a p+-type contact region 72 adjacent to the n+-type source region 8, and a thick insulation layer 12 formed on the p-type compartment region 2.

The drain/drift region 22 as a lower layer and the n-type drift path region 1 as an upper layer are contacted together in parallel through the p-type compartment region 2. Comparing the present embodiment with the structure of FIG. 2B, the n-type drift path region 1 is additionally provided on the p-type compartment region 2. As described above, it is possible to increase the breakdown voltage as a result of widening the depletion layers from the p-type compartment region 2 to the drain/drift region 22 as the under layer thereof and to the drift path region 1 as the upper layer thereof, respectively, resulting in a drop in the ON resistance. The net doping concentration of the drain/drift region 22 of the structure shown in FIG. 2B is approximately $2 \times 10^{12}/cm^2$, while the structure of the present invention has the net doping concentration (i.e., the sum of doping concentration of the under layered drain/drift region 22 and the upper layered drift path region 1) of approximately $3 \times 10^{12}/cm^2$ which is 1.5-fold the concentration of the conventional one. According to the present embodiment, therefore, it is possible to obtain the trade-off relationship between the ideal breakdown voltage and the ideal ON resistance represented by the line D in FIG. 4. As is evident from the above description, the above trade-off relationship can be eased by the present structure compared with the conventional one.

A method for fabricating the structure of each of the fifth and sixth embodiments includes the steps of: forming an-type semiconductor layer 3 (22) by implanting phosphorus ions into a p-type semiconductor and subjecting to a heat treatment (i.e., thermal dispersion)) forming a p-type region 14 (24) on a surface of the n-type semiconductor layer 3 (22) by selectively implanting boron ions and subjecting to a heat treatment (i.e., thermal dispersion), and subjecting the obtained intermediate structure to a thermal oxidization to form a thin n-type top side region 2b (n-type drift path region 1) on a surface layer through the use of concentrated phosphorus ions which are unevenly distributed on a surface of the silicon and diluted boron ions which are unevenly distributed into the oxidized film. In this case, there is no reverse conductive type layer adjacent to the upper layer of the n-type drift path region 1 or the n-type top side region 2b. Hence, it is enough to provide a thin layer to readily deplete the second n-type drift path region. The fabrication method of the present embodiment does not require the step of doping impurities and it provides the n-type top side region 2b (n-type drift path region 1) only by the step of the thermal oxidation, contributing a way for reducing the total number of steps and the practical mass production of semiconductor devices.

In the fifth preferred embodiment, the gate insulation film 10 and the drain/drift region 14 are separated by the n-type top side region 2b because the n-type top side region 2b is formed on a substantially whole surface of the silicon surface layer using the above fabrication method. In this case, however, no problem occurs because the drain/drift region 14 can be electrically conducted by a channel inversion layer formed directly underneath the gate 10 if the n-type top side region 2b is formed as a thin film.

Embodiment 7

Figure 12A:
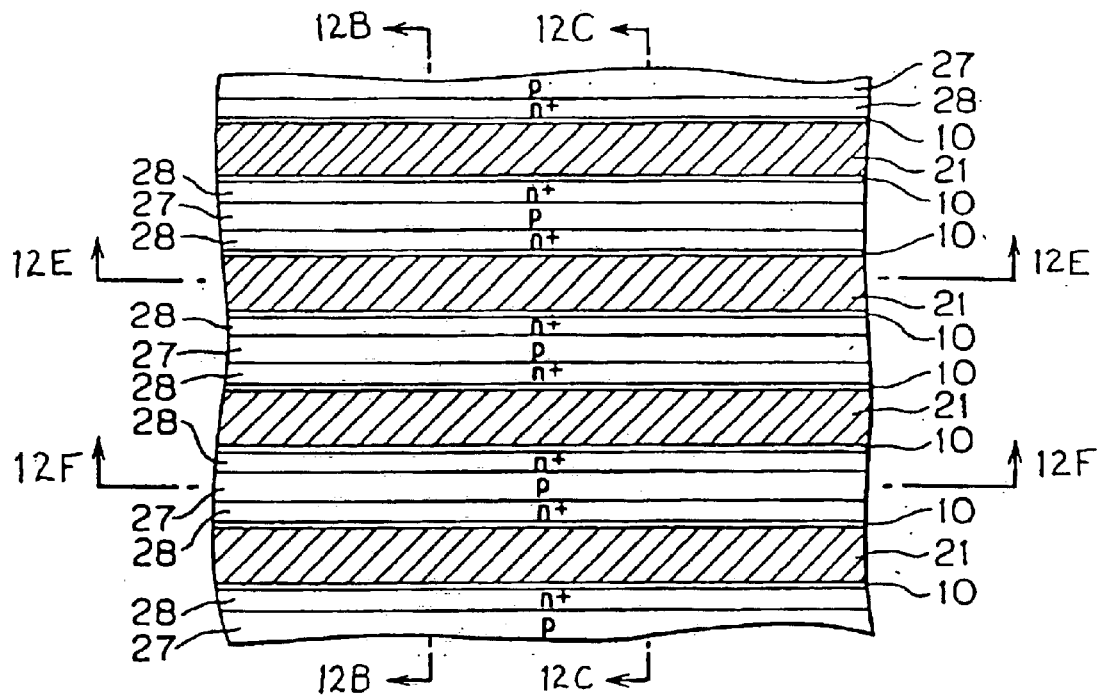
FIG. 12A is a plan view showing a trench gate n-channel MOSFET in the type of vertically structured as the seventh preferred embodiment of the semiconductor device in accordance with the present invention.
Figure 12B:
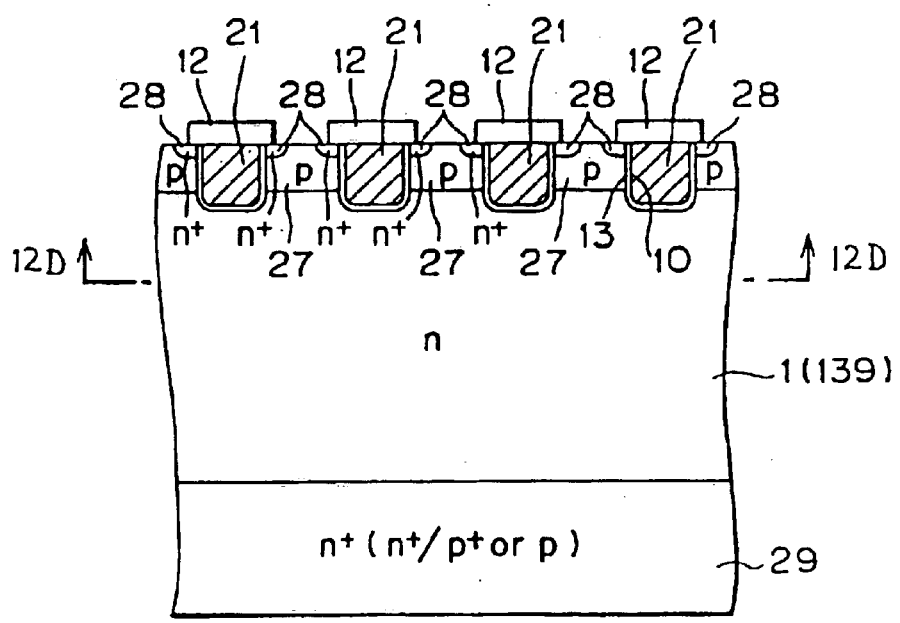
FIG. 12B is a cross sectional view taken along line 12B—12B in FIG. 12A.
Figure 12C:
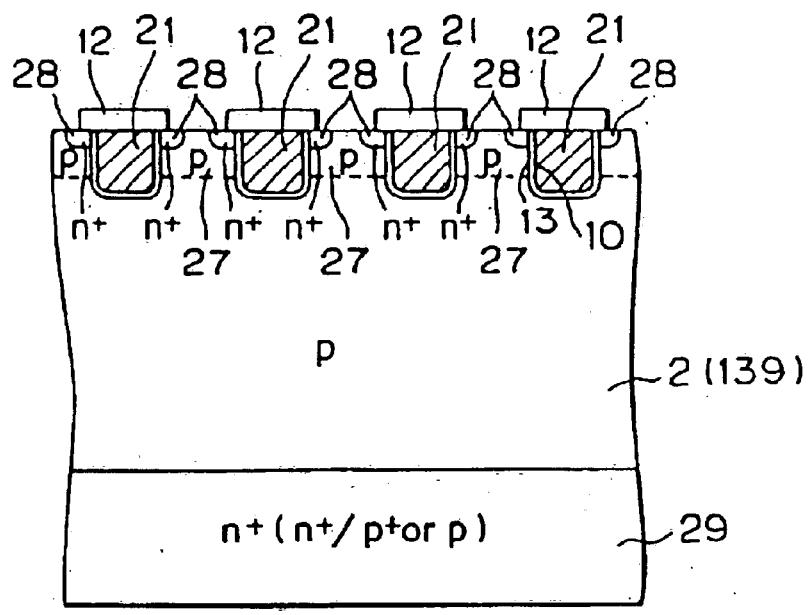
FIG. 12C is a cross sectional view taken along line 12C—12C in FIG. 12A.
Figure 12D:
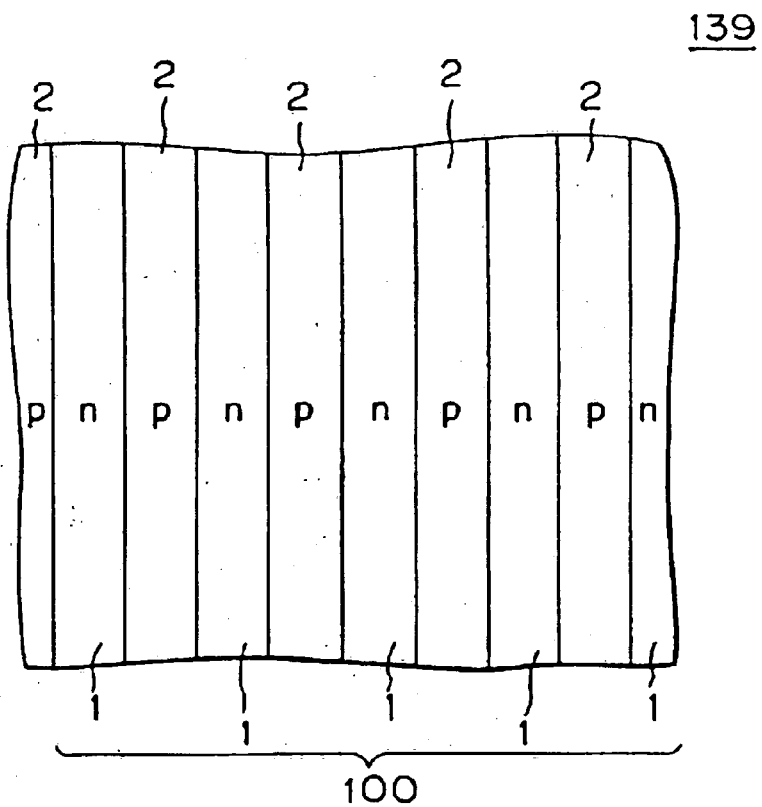
FIG. 12D is a cross sectional view taken along line 12D—12D in FIG. 12B.
Figure 12E:
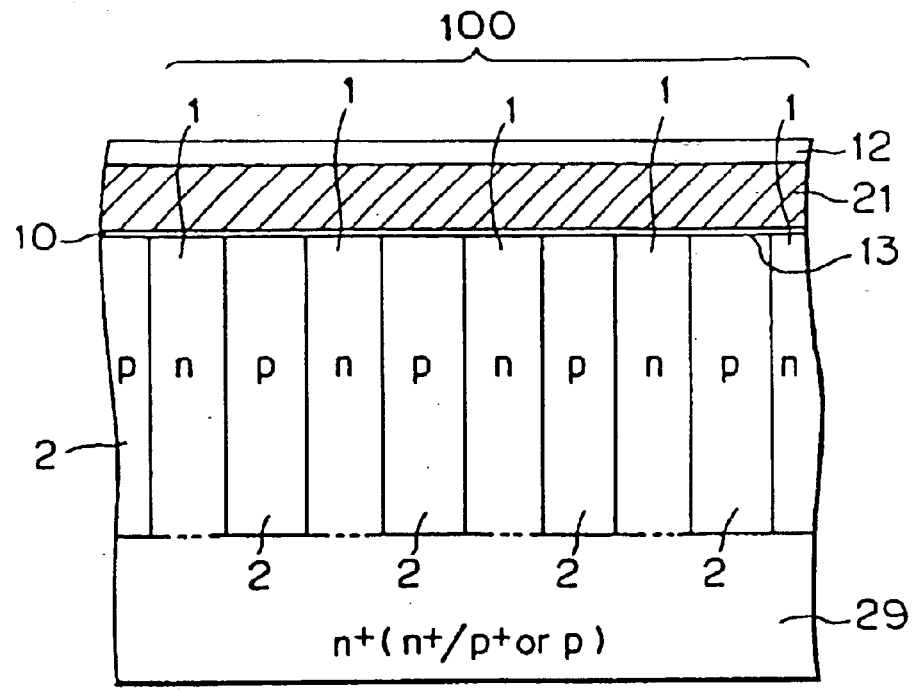
FIG. 12E is a cross sectional view taken along line 12E—12E in FIG. 12A.
Figure 12F:
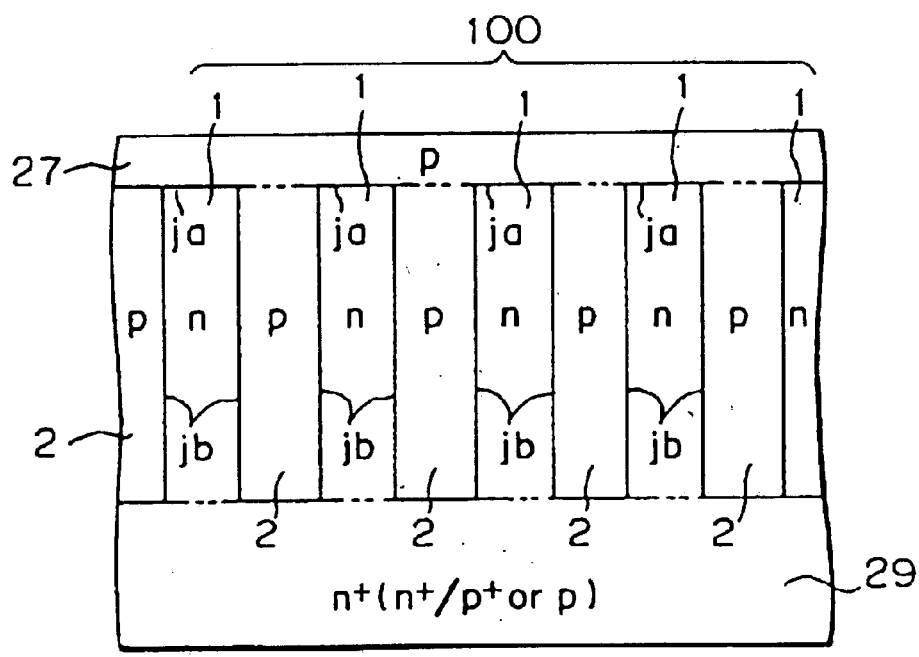
FIG. 12F is a cross sectional view taken along line 12F—12F in FIG. 12A.

FIGS. 12A to FIGS. 12F show a trench gate n-channel MOSFET in the type of a vertical structure (hereinafter, referred as a vertical MOSFET) as a seventh embodiment of the present invention. In these figures, FIG. 12A is a plan view showing the vertical MOSFET; FIG. 12B is a cross sectional view along a line 12B—12B in FIG. 12A; FIG. 12C is a cross sectional view along a line 12C—12C in FIG. 12A; FIG. 12D is a cross sectional view along a line 12D—12D in FIG. 12A; FIG. 12E is a cross sectional view along a line 12E—12E in FIG. 12A; and FIG. 12F is a cross sectional view along a line 12F—12F in FIG. 12A.

The vertical MOSFET comprises an n+-type drain layer 29 electrically contacted to a back electrode (not shown), a drain/drift region 139 formed on the n+-type drain layer 29, a trench gate electrode 21 imbedded in a trench formed on a surface of the drain/drift region 139 via a gate insulation film 10, a p-type channel diffusion layer 27 formed on a surface of the drain/drift region 139 at a relatively shallow depth compared with that of the trench gate electrode 21, a n+-type source region 28 formed along an upper edge of the trench gate electrode 21, and a thick insulation film 12 as a sheathing of the gate electrode 21. By the way, it is possible to make a n-type IGBT structure using a p-type layer or a double layered structure made of an n+-type upper layer and a p+-type under layer instead of the single layered n+-type drain layer 29.

According to the present embodiment, as shown in FIGS. 12D to 12F, the drain/drift region 139 comprises a plurality of plate-shaped divided regions in the vertical direction, in which n-type drift path regions 1 and p-type compartment regions 2, which are alternately arranged in parallel in the vertical direction to form a parallel stripe structure. An upper end of each the n-type drift path regions 1 is connected to the p-type channel diffusion layer 27 to form a p-n junction, while a lower end thereof is connected to the n+-type drain layer 29. Thus the n-type drift path regions 1 are arranged in parallel to form a drift path group 100 branched off from the n+-type drain layer 29. In addition, not shown in the figure, there is a p-type semiconductor side region adjacent to a longitudinal side of a n-type drift path region 1 positioned at each side of the drift path group 100, and also each of the n-type drift path regions 1 is sandwiched between p-type semiconductor side regions or p-type compartment regions. Furthermore, the upper end of each of the p-type compartment regions 2 is connected to the p-type channel diffusion layer 27, while the lower end thereof is connected to the n+-type drain layer 29 to form a p-n junction. Therefore, the respective p-type compartment regions 2 are branched off from the p-type channel diffusion region 27 and form a parallel connection with the respective n+-type drain regions 29.

If the vertical MOSFET is in the OFF mode, the channel inversion layer 13 directly below the gate insulation film 10 disappears. Due to the potential between the drain and the source, in addition, depletion layers are widened from the p-n junction ja between the n-type drift path region 1 and the p-type channel diffusion region 27 and the p-n junction jb between the n-type drift path region 1 and the p-type compartment region 2 into the n-type drift path region 1, resulting in a depletion of the n-type drift path region 1. In this case, one end of the depletion layer is widened from the p-n junction ja along a path length in the n-type drift path region 1 and the other end thereof is widened from the p-n junction jb along a path width in the n-type drift path region 1. That is, the depletion layer is widened from both sides to accelerate the depletion, and at the same time the p-type compartment region 2 is also depleted. Especially in the present invention, as described above, the depletion region can be extended from both longitudinal sides of the second conductive type compartment region 2 into the adjacent regions 1, 1, respectively. Elongating ends of the depletion region act effectively on the respective divided drift path regions 1, 1, so that the total width of the second conductive type compartment region 2 to be required for forming the depletion layer may be reduced. Meanwhile, the cross sectional area of the first conductive divided drift path region 1 may be increased by about the same extent, resulting in a drop in the ON resistance compared with the conventional device. In addition, the trade-off relationship between the ON resistance and the breakdown voltage can be relaxed roughly proportional to increase the number of the n-type divided drift path regions 1 per unit area (i.e., the number of divided regions per unit area).

Figure 3:
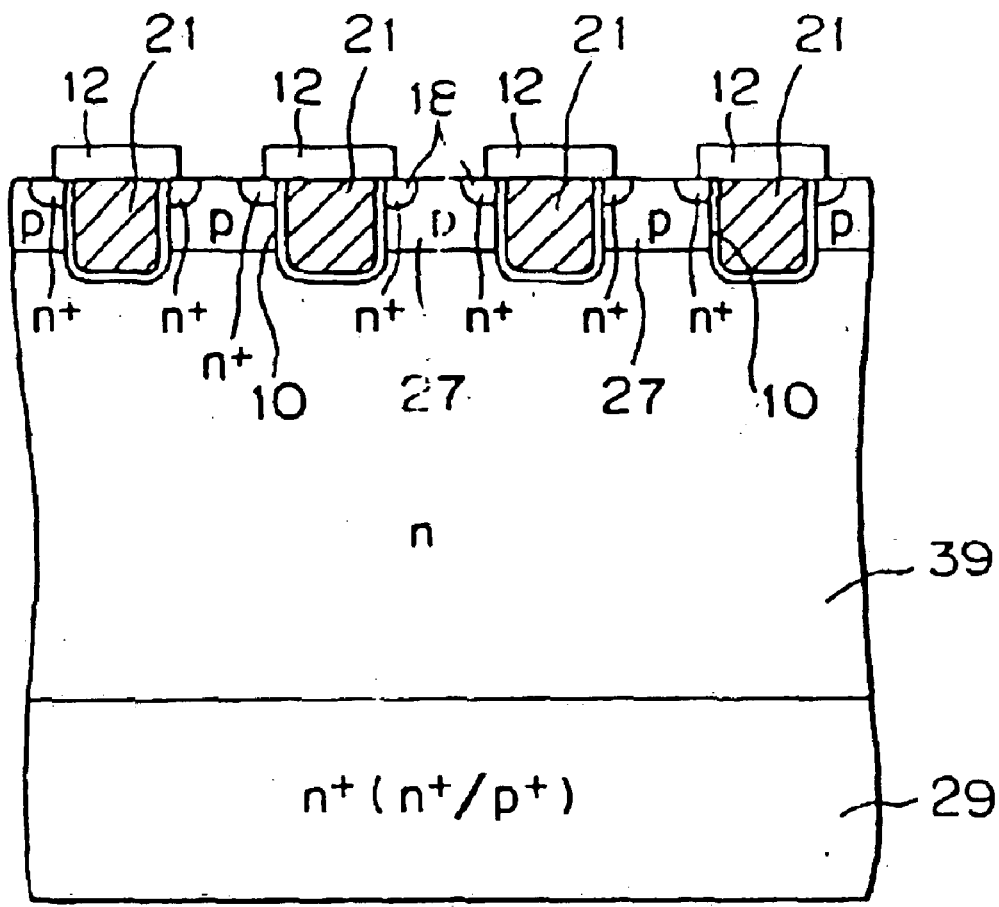
FIG. 3 is a cross sectional view showing an example of the conventional n-channel MOSFET in the type of trench gate.

For the sake of clarity, the ON resistance R of the vertical MOSFET of the present embodiment will be compared with that of the conventional n-channel MOSFET of FIG. 3 with the ideal breakdown voltage BV=100 V.

Figure 4:
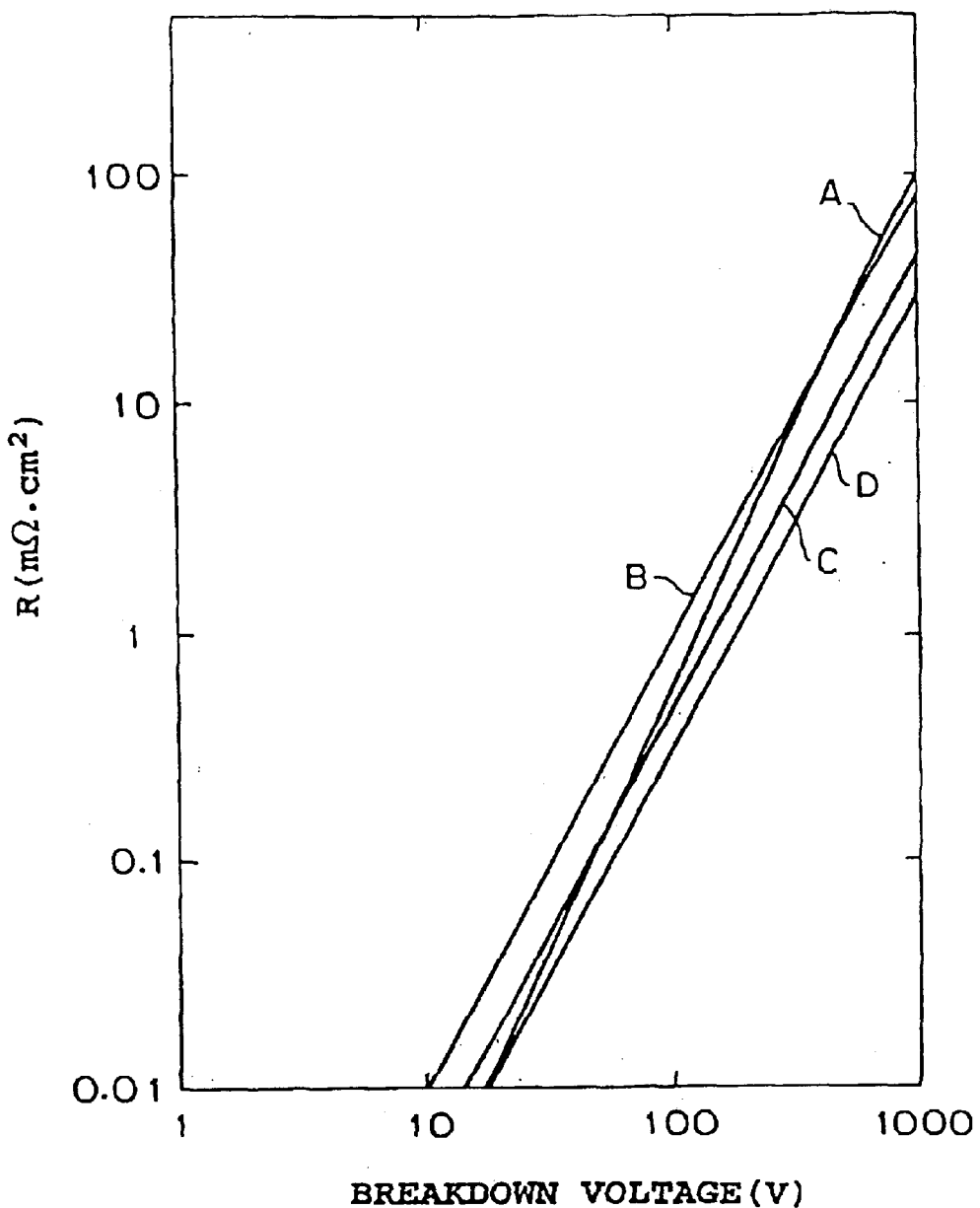
FIG. 4 is a graph that illustrates the relationship between an ideal breakdown voltage and an ideal ON resistance of each silicon n-channel MOSFET.

In the case of the conventional one, the ideal ON resistance R is approximately 0.6 (m·ohm·cm$^2$) according to the line A in FIG. 4. In the case of the present embodiment, on the other hand, the ideal ON resistance R is 1.6 (m·ohm·cm$^2$) when W=10 ìm; 0.16 (m·ohm·cm$^2$) when W=1 ìm; and 0.016 (m·ohm·cm$^2$) when W=0.1 ìm if a depth (path length) of each of the n-type drift path regions 1 and the p-type compartment regions 2 is 5 ìm and â is ⅔. Therefore, a noticeable reduction of the ideal ON resistance R can be further obtained. If the width of the p-type compartment region 2 is slightly larger than that of the n-type drift path region 1, a further noticeable improvement in the ideal ON resistance R can be obtained. For the mass-production of semiconductor devices, by the way, it is difficult to obtain the width of each region 1 or 2 less than 0.5 ìm by means of photolithography and ionimplantation at the present time. In the near future, however, further reduction in the ON resistance of the vertical MOSFET of the present embodiment will be achieved by lessening the wide of each region 1 or 2 less than 0.5 ìm as micromachining technology progresses.

Compared with the lateral semiconductor structure, the vertical semiconductor structure having the alternating of n-type divided drift regions 1 and p-type divided compartment regions 2 arranged in the vertical direction may be difficult to fabricate. However, it may be possible to fabricate the vertical semiconductor structure by the process including the steps of: forming an-type layer on a drain region 29 by means of epitaxial growth; removing the predetermined portions of the n-type layer by means of etching to form a plurality of grooves in the shape of stripes at established spacing; and molding the etched grooves by means of p-type epitaxial growth and removing undesired portions, or by the process including the steps of selectively implanting neutrons or high energy particles having long ranges and performing a nuclear transformation of the implanted particles to selectively form a deep reverse conductive region.

The invention has been described in detail with respect to various embodiments. The structure associated with the present invention is not limited to the drain/drift region of MOSFET described above. It is also possible to use a semiconductor region which becomes a depletion region if the device is in the OFF mode and also becomes a drift region if the device is in the ON mode, and furthermore most of the semiconductor elements such as an IGBT, a bipolar transistor, a semiconductor diode, a JFET, a thyristor, a MESFET, and a HEMT. According to the present invention, the conductive type can be changed to a reversed conductive type in case of necessity. In FIGS. 5A to 5C, there are the structures having a plurality of divided substructures in parallel, such as a layered structure, a fiber structure, and a honeycomb structure, respectively, but not limited to these shapes. It is also possible to use other shapes.

As described above, the present invention has the features including: a set of first conductive type drift regions provided in a parallel divided structure, wherein in each of the divided drift regions a drift current flows if it is in the ON mode while each divided drift region is depleted if it is in the OFF mode; and a second conductive type compartment region placed in an interface of the side surfaces of the adjacent drift regions to form a p-n junction.

Accordingly, the present invention produces at least the following effects.

(1) The depletion region can be widened from both longitudinal sides of the second conductive type compartment region into the adjacent regions, respectively. Widening ends of the depletion region act effectively on the respective divided drift path regions, so that the total width of the second conductive type compartment region to be required for forming the depletion layer may be reduced, while the cross sectional area of the first conductive divided drift path region may be increased by about the same extent, resulting in a drop in the ON resistance compared with the conventional device. Accordingly, the trade-off relationship between the ON resistance and the breakdown voltage can be eased if the number of the first conductive type divided drift path regions per unit area (i.e., the number of divided regions per unit area) is increased.

(2) The drift region can be fabricated as a stripe structure by alternately arranging the respective first conductive type divided drift path regions in the shape of stripes and the respective second conductive type compartment regions in the shape of stripes on a plane. The stripe shaped p-n junction repeated structure on the plane may be formed by performing a photolithography one time, resulting in a simple manufacturing process and a low production cost for the semiconductor device.

(3) The drift region to be provided in the lateral type semiconductor device may be a superposed parallel structure by alternatively laminating the respective first conductive type divided drift path region in the shape of a flat layer and the respective second conductive type compartment region in the shape of a flat layer. A thickness of each layer can be precisely decreased as much as possible using a metal organic chemical vapor deposition (MOCVD) or a molecular beam epitaxy (MBE), so that the trade-off relationship between the ON resistance and the breakdown voltage can be substantially eased.

(4) The most simple drift region of the lateral type semiconductor device comprises a first conductive type divided drift region formed on a second conductive type semiconductor layer, a well-shaped second conductive type compartment region formed on the first conductive type divided drift path region, another first conductive type divided drift path second region formed on a surface layer of the second conductive type compartment region and connected to the first conductive type divided drift path region. The ON resistance of the semiconductor device can be reduced by connecting the another first conductive type divided drift path region with the first conductive type divided drift path region in parallel. In this structure, there is no reverse conductive type layer adjacent to the upper layer of the secondary first conductive type divided drift path region. Hence, the depletion can be easily obtained with the decrease in a thickness of the layer.

(5) The fabrication method of the present invention does not require the step of doping impurities. The second n-type divided drift region is provided only by the step of the thermal oxidation, contributing to reduced cost and a reduced number of steps for the practical mass production of semiconductor devices.

(6) The drift region of the vertical type semiconductor device comprises a plurality of first conductive type divided drift regions and a plurality of second conductive compartment regions, in which each region is in the shape of layer in the vertical direction. The respective first conductive type divided is drift regions and the respective second conductive type compartment regions are alternately stacked in parallel in the lateral direction. In the process for fabricating this structure, an etching step can be required for forming a deep groove. In this case, however, it is also possible to substantially ease the trade-off relationship between the ON resistance and the breakdown voltage of the vertical type semiconductor device.

What is claimed is:

1. A semiconductor device comprising:

a second conductivity type semiconductor layer;

a first first conductivity type region formed on the second conductivity type semiconductor layer, said first first conductivity type region having a drift current flowing between a channel just under a gate electrode and a drain electrode in lateral direction in an ON mode, said first first conductivity type region being depleted in an OFF mode;

a second conductivity type region formed on the first conductivity type region, said second conductivity type region not having a drift current flowing in the ON mode, said drift region being depleted in the OFF mode; and a second first conductivity type region formed on a surface side of the second conductivity type region, said second first conductivity type region being electrically connected in parallel to said first first conductivity type region at an edge of channel side and an edge of drain side, said second first conductivity type region having a drift current flowing in lateral direction in an ON mode, said second first conductivity type region being depleted in an OFF mode, wherein said second conductivity type region is not conductively connected to said drain and gate electrodes.

2. A semiconductor device as claimed in claim 1, wherein said gate electrode has a field plate, and wherein an edge of a channel side of said second conductivity type region extends under said field plate.

3. A semiconductor device comprising:

a second conductivity type semiconductor layer;

a first first conductivity type region formed on the second conductivity type semiconductor layer, said first first conductivity type region having a drift current flowing between a channel just under a gate electrode and a drain electrode in lateral direction in an ON mode, said first first conductivity type region being depleted in an OFF mode;

a second conductivity type region formed on the first conductivity type region, said second conductivity type region not having a drift current flowing in the ON mode, said draft region being depleted an the OFF mode; and a second first conductivity type region formed on a surface side of the second conductivity type region, said second first conductivity type region being electrically connected in parallel to said first first conductivity type region at an edge of channel side and an edge of drain side, said second first conductivity type region having a drift current flowing in lateral direction in an ON mode, said second first conductivity type region being depleted in an OFF mode, wherein said gate electrode has a field plate, and wherein an edge of a channel side of said second conductivity type region extends under said field plate.

* * * * *